US008711596B2

(12) United States Patent
Yan et al.

(10) Patent No.: US 8,711,596 B2
(45) Date of Patent: *Apr. 29, 2014

(54) MEMORY SYSTEM WITH DATA LINE SWITCHING SCHEME

(75) Inventors: Tianhong Yan, San Jose, CA (US); Luca Fasoli, Campbell, CA (US)

(73) Assignee: Sandisk 3D LLC, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/601,869

(22) Filed: Aug. 31, 2012

(65) Prior Publication Data

US 2013/0010523 A1 Jan. 10, 2013

Related U.S. Application Data

(62) Division of application No. 12/563,139, filed on Sep. 20, 2009, now Pat. No. 8,279,650.

(60) Provisional application No. 61/171,022, filed on Apr. 20, 2009.

(51) Int. Cl.

*G11C 5/02* (2006.01)
*G11C 11/00* (2006.01)
*G11C 5/06* (2006.01)

(52) U.S. Cl.

USPC ................................ 365/51; 365/148; 365/63

(58) Field of Classification Search

None

See application file for complete search history.

(56) References Cited

U.S. PATENT DOCUMENTS 3,983,537 A 9/1976 Parsons
5,111,071 A 5/1992 Kwan
5,159,572 A 10/1992 Morton
5,315,541 A 5/1994 Harari
5,369,614 A 11/1994 Miyanishi
5,589,759 A 12/1996 Borgato
5,623,436 A 4/1997 Sowards
5,712,815 A 1/1998 Bill
5,742,787 A 4/1998 Talreja
5,812,457 A 9/1998 Arase
5,835,396 A 11/1998 Zhang (Continued)

FOREIGN PATENT DOCUMENTS

CN 1620699 5/2005
CN 1759482 4/2006

(Continued)

OTHER PUBLICATIONS

Preliminary Amendment filed Oct. 5, 2012 in U.S. Appl. No. 13/537,029.

(Continued)

*Primary Examiner* — Hoai V Ho
*Assistant Examiner* — James G Norman
(74) *Attorney, Agent, or Firm* — Vierra Magen Marcus LLP

(57) ABSTRACT

A storage system includes a three-dimensional memory array that has multiple layers of non-volatile storage elements grouped into blocks. Each block includes a subset of first selection circuits for selectively coupling a subset of array lines (e.g. bit lines) of a first type to respective local data lines. Each block includes a subset of second selection circuits for selectively coupling a subset of the respective local data lines to global data lines that are connected to control circuitry. To increase the performance of memory operations, the second selection circuits can change their selections independently of each other.

8 Claims, 14 Drawing Sheets

208
204
200
220
204
218
200
206

(56) References Cited

U.S. PATENT DOCUMENTS 5,841,696 A 11/1998 Chen
5,847,998 A 12/1998 Van Buskirk
5,894,437 A 4/1999 Pellegrini
5,912,839 A 6/1999 Ovshinsky
5,915,167 A 6/1999 Leedy
5,963,465 A 10/1999 Eitan
6,034,882 A 3/2000 Johnson
6,091,633 A 7/2000 Cernea
6,094,374 A 7/2000 Sudo
6,141,241 A 10/2000 Ovshinsky
6,141,253 A 10/2000 Lin
6,144,585 A 11/2000 Hazama
6,214,666 B1 4/2001 Mehta
6,243,290 B1 6/2001 Kurata
6,269,022 B1 7/2001 Ra
6,282,117 B1 8/2001 Tanaka
6,292,048 B1 9/2001 Li
6,301,161 B1 10/2001 Holzmann
6,307,785 B1 10/2001 Takeuchi
6,331,943 B1 12/2001 Naji et al.
6,333,881 B1 12/2001 Kusunoki et al.
6,420,215 B1 7/2002 Knall
6,426,893 B1 7/2002 Conley
6,473,332 B1 10/2002 Ignatiev et al.
6,525,953 B1 2/2003 Johnson
6,529,409 B1 3/2003 Nguyen
6,529,410 B1 3/2003 Han
6,532,172 B2 3/2003 Harari
6,542,428 B2 4/2003 Hidaka
6,563,369 B1 5/2003 Comer
6,574,145 B2 6/2003 Kleveland
6,614,688 B2 9/2003 Jeong
6,657,889 B1 12/2003 Subramanian
6,735,104 B2 5/2004 Scheuerlein
6,809,462 B2 10/2004 Pelrine
6,856,541 B2 2/2005 Cernea
6,856,572 B2 2/2005 Scheuerlein
6,871,257 B2 3/2005 Conley
6,873,538 B2 3/2005 Hush
6,879,505 B2 4/2005 Scheuerlein
6,937,510 B2 8/2005 Hosono
6,951,780 B1 10/2005 Herner
6,952,030 B2 10/2005 Herner
6,952,043 B2 10/2005 Vyvoda
7,002,085 B2 2/2006 Ullmann
7,042,765 B2 5/2006 Sibigtroth
7,068,538 B2 6/2006 Devin
7,068,539 B2 6/2006 Guterman
7,081,377 B2 7/2006 Cleeves
7,126,841 B2 10/2006 Rinerson
7,286,439 B2 10/2007 Fasoli
7,301,839 B2 11/2007 Li
7,307,884 B2 12/2007 Guterman
7,359,279 B2 4/2008 Fasoli
7,362,604 B2 4/2008 Scheuerlein
7,369,428 B2 5/2008 Jeong
7,391,638 B2 6/2008 Fasoli
7,420,850 B2 9/2008 Fasoli
7,447,075 B2 11/2008 Guterman
7,453,730 B2 11/2008 Guterman
7,869,258 B2 1/2011 Scheuerlein
7,978,507 B2 7/2011 Scheuerlein
8,098,511 B2 1/2012 Scheuerlein et al.
8,111,539 B2 2/2012 Fasoli et al.
8,130,528 B2 3/2012 Yan
8,270,210 B2 9/2012 Scheuerlein
2002/0057598 A1 5/2002 Sakamoto
2002/0071312 A1 6/2002 Tanaka
2003/0117831 A1 6/2003 Hush
2004/0032788 A1 2/2004 Sakui
2004/0036103 A1 2/2004 Chen
2004/0124466 A1 7/2004 Walker et al.
2004/0160798 A1 8/2004 Rinerson
2004/0202028 A1* 10/2004 Cioaca .................... 365/189.11
2005/0162898 A1 7/2005 Nejad
2005/0162908 A1 7/2005 Kato
2006/0062043 A1 3/2006 Roehr
2006/0133145 A1* 6/2006 Park et al. ................ 365/185.12
2006/0157679 A1 7/2006 Scheuerlein
2006/0250836 A1 11/2006 Herner
2006/0291291 A1* 12/2006 Hosono et al. ........... 365/185.22
2007/0002610 A1 1/2007 Knall
2007/0008773 A1 1/2007 Scheuerlein
2007/0076479 A1 4/2007 Kim et al.
2007/0091680 A1 4/2007 Conley
2007/0109850 A1 5/2007 Li et al.
2007/0190722 A1 8/2007 Herner
2007/0285971 A1 12/2007 Toda et al.
2008/0025061 A1 1/2008 Scheuerlein
2008/0025132 A1 1/2008 Fasoli
2008/0062739 A1 3/2008 Bill et al.
2008/0062740 A1 3/2008 Baek
2008/0094892 A1 4/2008 Fasoli
2008/0106931 A1 5/2008 Toda
2008/0151601 A1 6/2008 Kang
2008/0151637 A1 6/2008 Doyle
2008/0316798 A1 12/2008 Tanizaki
2009/0116280 A1 5/2009 Parkinson
2009/0323392 A1 12/2009 Fasoli
2009/0323393 A1 12/2009 Scheuerlein
2010/0085822 A1 4/2010 Yan
2010/0259960 A1* 10/2010 Samachisa ...................... 365/51
2010/0265750 A1 10/2010 Yan
2011/0075468 A1 3/2011 Scheuerlein

FOREIGN PATENT DOCUMENTS

CN 101189679 5/2008
EP 1308960 7/2003
EP 1426969 6/2004
GB 2434901 8/2007
WO WO9808225 2/1998
WO 2008030351 3/2008

OTHER PUBLICATIONS

International Search Report dated Dec. 4, 2009 in PCT Application No. PCT/US2009/058889.
Written Opinion of the International Searching Authority dated Dec. 4, 2009 in PCT Application No. PCT/US2009/058889.
International Search Report dated Dec. 8, 2009 in PCT Application No. PCT/US2009/058890.
Written Opinion of the International Searching Authority dated Dec. 8, 2009 in PCT Application No. PCT/US2009/058890.
Response to the Written Opinion dated Nov. 28, 2011, EP Patent Application No. 09737244.5.
Office Action dated Feb. 23, 2011, U.S. Appl. No. 12/563,140, filed Sep. 20, 2009.
Response to Office Action dated May 16, 2012, U.S. Appl. No. 12/563,140, filed Sep. 20, 2009.
Notice of Allowance dated May 27, 2011, U.S. Appl. No. 12/563,140, filed Sep. 20, 2009.
Office Action dated Dec. 16, 2011, U.S. Appl. No. 13/217,235.
Response to Office Action dated Mar. 15, 2012, U.S. Appl. No. 13/217,235.
Notice of Allowance dated Mar. 29, 2012, U.S. Appl. No. 13/217,235.
Office Action dated Sep. 14, 2011, U.S. Appl. No. 12/563,139.
Response to Office Action dated Jan. 11, 2012, U.S. Appl. No. 12/563,139.
Office Action dated Mar. 23, 2012, U.S. Appl. No. 12/563,139.
U.S. Appl. No. 12/563,140, filed Sep. 20, 2009.
U.S. Appl. No. 13/217,235, filed Aug. 24, 2011.
U.S. Appl. No. 13/537,029, filed Jun. 28, 2012.
U.S. Appl. No. 12/563,139, filed Sep. 20, 2009.
U.S. Appl. No. 13/479,145, filed May 23, 2012.
Response to Office Action dated May 18, 2012, U.S. Appl. No. 12/563,139.
Notice of Allowance dated Jun. 4, 2012, U.S. Appl. No. 12/563,139.
European Response to Written Opinion dated Jun. 8, 2012, European Patent Application No. 09793151.3.
U.S. Appl. No. 12/339,338, filed Sep. 20, 2009.

(56) References Cited

OTHER PUBLICATIONS

Office Action dated Mar. 22, 2011, U.S. Appl. No. 12/339,338.
Response to Office Action dated Jul. 22, 2011, U.S. Appl. No. 12/339,338.
Notice of Allowance dated Aug. 12, 2011, U.S. Appl. No. 12/339,338.
PCT International Search Report dated Oct. 22, 2009, PCT Patent Application No. PCT/US2009/048955.
Written Opinion of the International Searching Authority dated Oct. 22, 2009, PCT Patent Application No. PCT/US2009/048955.
Response to Written Opinion, dated Mar. 11, 2011, European Patent Application No. 09771207.9.
U.S. Appl. No. 13/237,773, filed Sep. 20, 2011.
Office Action dated Mar. 20, 2012, U.S. Appl. No. 13/237,773.
Response to Office Action dated Aug. 20, 2012 with Terminal Disclaimer, U.S. Appl. No. 13/237,773.
Notice of Allowance dated Sep. 7, 2012, U.S. Appl. No. 13/237,773.
U.S. Appl. No. 12/339,327, filed Dec. 9, 2008.
Office Action dated Jul. 7, 2011, U.S. Appl. No. 12/339,327.
Response to Office Action dated Oct. 6, 2011, U.S. Appl. No. 12/339,327.
Notice of Allowance dated Oct. 13, 2011, U.S. Appl. No. 12/339,327.
International Search Report dated Sep. 14, 2009, PCT Appl. No. PCT/US/2009/048951.
Written Opinion of the International Searching Authority dated Sep. 14, 2009, PCT Appl. No. PCT/US/2009/048951.
Response to Written Opinion, dated Mar. 14, 2011, European Patent Application No. 09771204.6.
Office Action dated Feb. 28, 2013 in U.S. Appl. No. 13/479,145, 40 pages.
Response to Office Action filed Jun. 27, 2013 in U.S. Appl. No. 13/479,145, 8 pages.
Notice of Allowance dated Sep. 17, 2013, U.S. Appl. No. 13/479,145.
Notice of Allowance and Fee(s) Due dated Jun. 10, 2013 in U.S. Appl. No. 13/537,029, 31 pages.
First Office Action dated May 24, 2013 in Chinese Patent Application No. 200980139725.6, 17 pages.
English Abstract for CN1620699 published May 25, 2005.
English Abstract for CN1759482 published Apr. 12, 2006.
English Abstract for CN101189679 published May 28, 2008.
Response to Office Action dated Oct. 8, 2013 in Chinese Patent Application No. 200980139725.6.
English Translation of Amended Claims filed in the Response to Office Action dated Oct. 8, 2013 in Chinese Patent Application No. 200980139725.6.
First Office Action dated Jun. 25, 2013 in Japanese Patent Application No. 2011-530151.
Response to Office Action dated Aug. 23, 2013 in Japanese Patent Application No. 2011-530151.
English Translation of Amended Claims filed in the Response to Office Action filed Aug. 23, 2013 in Japanese Patent Application No. 2011-530151.

* cited by examiner 208
204
200
220
204
218
200
206

210
209
200
$A_2$
204
221
219
209
200
$A_1$
207
209

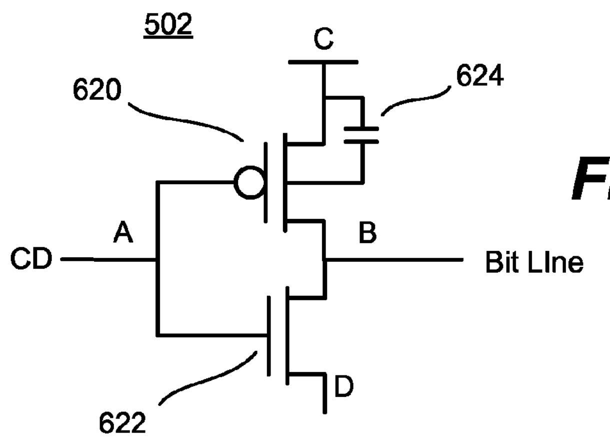
Fig. 9
Fig. 10
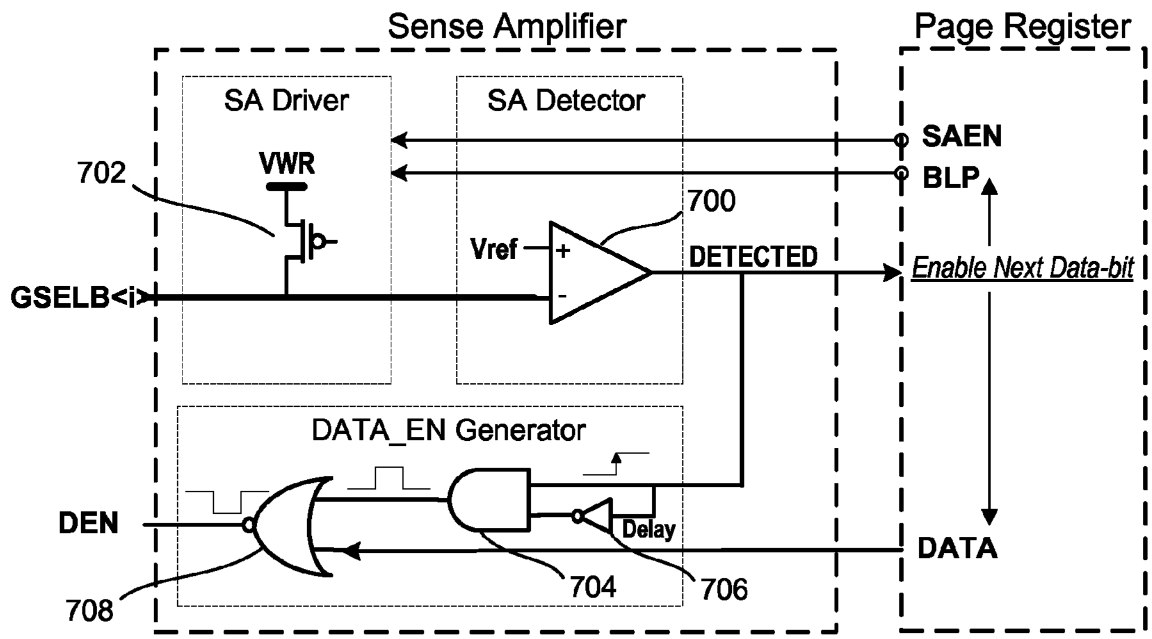

MEMORY SYSTEM WITH DATA LINE SWITCHING SCHEME

PRIORITY

This application is a divisional application of U.S. patent application Ser. No. 12/563,139, "MEMORY SYSTEM WITH DATA LINE SWITCHING SCHEME," by Tianhong Yan and Luca Fasoli, filed on Sep. 20, 2009 which claims the benefit of priority of U.S. Provisional Application No. 61/171,022, "DATA DEPENDENT DATA-LINE SWITCHING SCHEME," by Thomas Yan and Luca Fasoli, filed on Apr. 20, 2009, both of which are incorporated herein by reference.

BACKGROUND

1. Field

The present invention relates to technology for data storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. When semiconductor memory is used in consumer electronic devices, consumers generally want the semiconductor memory to perform at sufficient speeds so that the memory does not slow down operation of the electronic device.

BRIEF DESCRIPTION OF THE DRAWINGS

FIG. 9 is a schematic diagram of one embodiment of a selection circuit.

FIG. 10 is a schematic diagram of a portion of one embodiment of a sense amplifier circuit.

DETAILED DESCRIPTION

A storage system includes one or more layers of non-volatile storage elements grouped into blocks. Each block includes a subset of first selection circuits for selectively coupling a subset of array lines of a first type to respective local data lines. Each block includes a subset of second selection circuits for selectively coupling a subset of the respective local data lines to global data lines that are connected to control circuitry. To increase the performance of memory operations, the second selection circuits can change their selections independently of each other. For example, a memory operation is performed concurrently on a first non-volatile storage element of each group of a plurality of groups of non-volatile storage elements. Completion of the memory operation for the first non-volatile storage element of each group is independently detected. A memory operation on a second non-volatile storage element of each group is independently commenced for each group upon independently detecting completion of the memory operation for the first non-volatile storage element of the respective group.

A non-volatile storage system is disclosed that includes a plurality of non-volatile storage elements, a set of signal driving circuits, and selection circuitry. The selection circuitry selectively connects either a first set of the non-volatile storage elements to the set of signal driving circuits or a second set of the non-volatile storage elements to the set of signal driving circuits. The set of signal driving circuits, which in one embodiment includes sense amplifiers, start a program operation for the first set of non-volatile storage elements while the selection circuitry connects the first set of non-volatile storage elements to the set of signal driving circuits. The selection circuitry disconnects the first set of non-volatile storage elements from the set of signal driving circuits and connects the second set of non-volatile storage elements to the set of signal driving circuits after starting the program operation for the first set of non-volatile storage elements and without waiting for completion of the program operation for the first set of non-volatile storage elements. The set of signal driving circuits start a program operation for the second set of non-volatile storage elements while the selection circuitry connects the second set of non-volatile storage elements to the set of signal driving circuits without waiting for completion of the program operation for the first set of non-volatile storage element.

Figure 1:
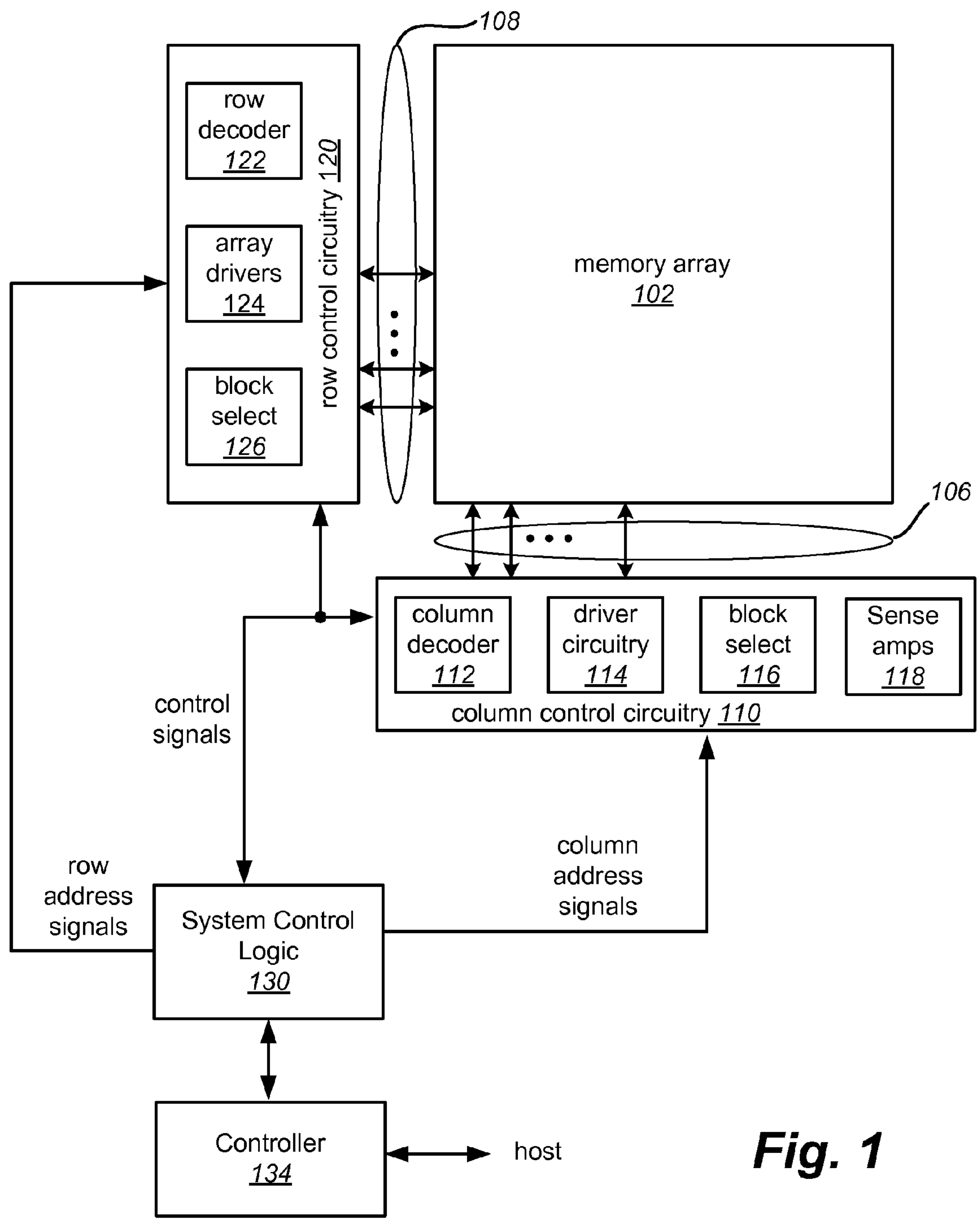
FIG. 1 is a block diagram of one embodiment of a memory system.

FIG. 1 is a block diagram that depicts one example of a memory system 100 that can implement the technology described herein. Memory system 100 includes a memory array 102, which can be a two or three-dimensional array of memory cells. In one embodiment, memory array 102 is a monolithic three-dimensional memory array. The array terminal lines of memory array 102 include the various layer(s) of word lines organized as rows, and the various layer(s) of bit lines organized as columns. However, other orientations can also be implemented.

Memory system 100 includes row control circuitry 120, whose outputs 108 are connected to respective word lines of the memory array 102. For purposes of this document, a connection can be a direct connection or indirect connection (e.g., via one or more other parts). Row control circuitry 120 receives a group of M row address signals and one or more various control signals from System Control Logic circuit 130, and typically may include such circuits as row decoders 122, array drivers 124, and block select circuitry 126 for both read and programming operations.

Memory system 100 also includes column control circuitry 110 whose input/outputs 106 are connected to respective bit lines of the memory array 102. Column control circuitry 110 receives a group of N column address signals and one or more various control signals from System Control Logic 130, and typically may include such circuits as column decoders 112, driver circuitry 114, block select circuitry 116, and sense amplifiers 118. In one embodiment, sense amplifiers 118 provide signals to the bit lines and sense signals on the bit lines. Various sense amplifiers known in the art can be used herein.

System control logic 130 receives data and commands from controller 134 and provides output data to controller 134. Controller 134 communicates with host. System control logic 130 may include one or more state machines, registers and other control logic for controlling the operation of memory system 100. In other embodiments, system control logic 130 receives data and commands directly from a host and provides output data to that host, because system control logic 130 includes the functionality of a controller.

In one embodiment, system control logic 130, column control circuitry 110, row control circuitry 120 and memory array 102 are formed on the same integrated circuit. For example, system control logic 130, column control circuitry 110 and row control circuitry 120 can be formed on the surface of a substrate and memory array 102 is a monolithic three-dimensional memory array formed above the substrate (and, therefore, above system control logic 130, column control circuitry 110 and row control circuitry 120). In some cases, a portion of the control circuitry can be formed on the same layers as some of the memory array. More information about suitable embodiments like that of FIG. 1 can be found in the following United States patents that are incorporated herein by reference in their entirety: U.S. Pat. Nos. 6,879,505; 7,286,439; 6,856,572; and 7,359,279. Controller 134 can be on the same substrate as or a different substrate than the other components depicted in FIG. 1. Controller 134, system control logic 130, column control circuitry 110, column decoder 112, driver circuitry 114, block select 116, sense amplifiers 118, row control circuitry 120, row decoder 122, array drivers 124 and/or block select 126, alone or in any combination, can be thought of as one or more control circuits.

Memory array 102 includes a plurality of memory cells. In one embodiment, each memory cell includes a steering element (e.g., a diode) and a resistance element. In one example implementation, the memory cells may be such that they can be programmed once and read many times. One example memory cell includes a pillar of layers formed at the intersection between the upper and lower conductors. In one embodiment, the pillar includes a steering element, such as a diode, that is connected in series with a state change element, such as an antifuse layer. When the antifuse layer is intact, the cell is electrically an open circuit. When the antifuse layer is breached, the cell is electrically a diode in series with the resistance of the breached antifuse layer. Examples of memory cells can be found in U.S. Pat. Nos. 6,034,882; 6,525,953; 6,952,043; 6,420,215; 6,951,780; and 7,081,377.

In another embodiment, memory cells are re-writable. For example, U.S. Patent Application Publication No. 2006/0250836, which is incorporated herein by reference in its entirety, describes a rewriteable non-volatile memory cell that includes a diode coupled in series with a reversible resistance-switching element. A reversible resistance-switching element includes reversible resistance-switching material having a resistance that may be reversibly switched between two or more states. For example, the reversible resistance-switching material may be in an initial high-resistance state upon fabrication that is switchable to a low-resistance state upon application of a first voltage and/or current. Application of a second voltage and/or current may return the reversible resistance-switching material to the high-resistance state. Alternatively, the reversible resistance-switching element may be in an initial low-resistance state upon fabrication that is reversibly switchable to a high-resistance state upon application of the appropriate voltage(s) and/or current(s). One resistance state may represent a binary "0" while another resistance state may represent a binary "1." More than two data/resistance states may be used so that the memory cell stores two or more bits of data. In one embodiment, the process of switching the resistance from the high-resistance state to the low-resistance state is referred to as a SET operation. The process of switching the resistance from the low-resistance state to the high-resistance state is referred to as a RESET operation. The high-resistance state is associated with binary data "0" and the low-resistance state is associated with binary data "1." In other embodiments, SET and RESET and/or the data encoding can be reversed. In some embodiments, the first time a resistance-switching element is SET requires a higher than normal voltage and is referred to as a FORMING operation.

Figure 2:
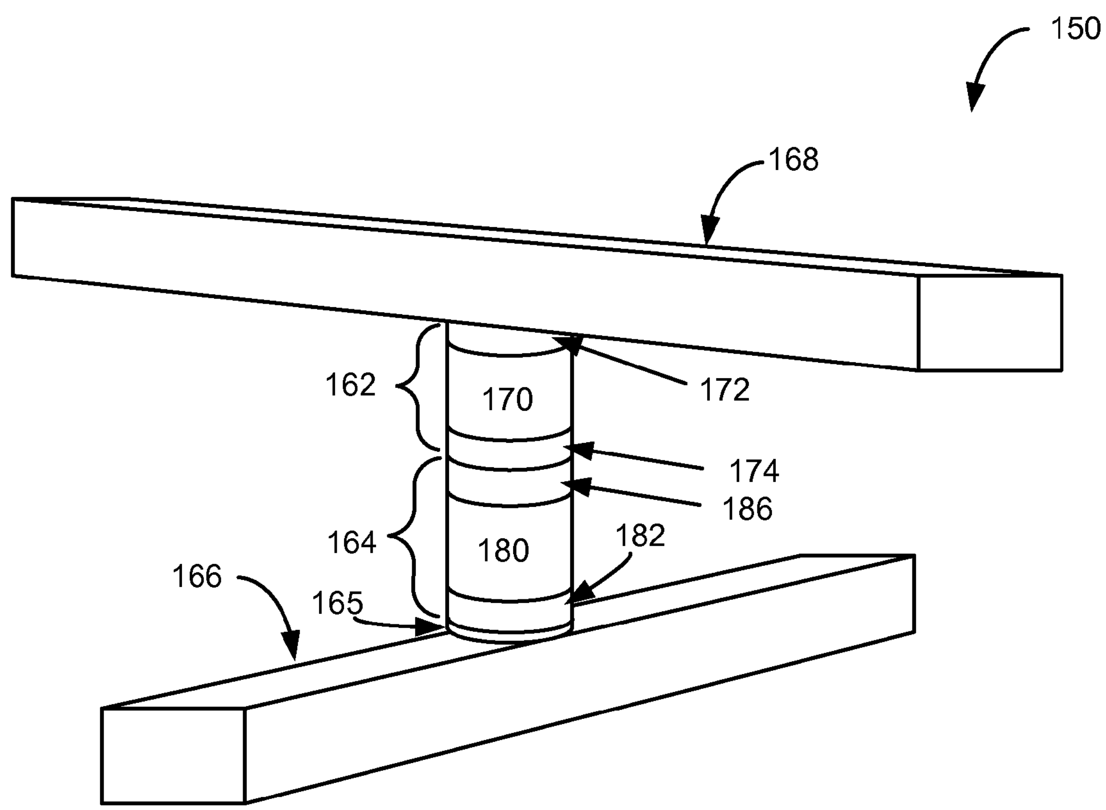
FIG. 2 is a simplified perspective view of one embodiment of a memory cell.

FIG. 2 is a simplified perspective view of one example of a memory cell 150 that includes reversible resistance-switching element 162, steering element 164 and barrier 165 coupled in series and positioned between a first conductor 166 and a second conductor 168.

Reversible resistance-switching element 263 includes reversible resistance-switching material 170 having a resistance that may be reversibly switched between two or more states. In some embodiments, reversible resistance-switching material 170 may be formed from a metal oxide. Various different metal oxides can be used. In one example, nickel oxide is be used.

In at least one embodiment, through use of a selective deposition process, a nickel oxide layer may be used in a reversible resistance-switching material without the nickel oxide layer being etched. For example, a reversible resistance-switching element may be formed by employing a deposition process such as electroplating, electroless deposition, or the like, to selectively deposit a nickel-containing layer only on conductive surfaces formed above a substrate. In this manner, only the conductive surfaces on the substrate are patterned and/or etched (prior to deposition of the nickel-containing layer) and not the nickel-containing layer.

In at least one embodiment, the reversible resistance-switching material 170 includes at least a portion of a nickel oxide layer formed by selectively depositing nickel and then oxidizing the nickel layer. For example, Ni, $Ni_xP_y$ or another similar form of nickel may be selectively deposited using electroless deposition, electroplating or a similar selective process, and then oxidized to form nickel oxide (e.g., using rapid thermal oxidation or another oxidation process). In other embodiments, nickel oxide itself may be selectively deposited. For example, an NiO-, $NiO_x$- or $NiO_xP_y$-containing layer may be selectively deposited above the steering element using a selective deposition process and then annealed and/or oxidized (if necessary).

Other materials may be selectively deposited, and then annealed and/or oxidized if necessary, to form reversible resistance-switching materials for use in memory cells. For example, a layer of Nb, Ta, V, Al, Ti, Co, cobalt-nickel alloy, etc., may be selectively deposited, such as by electroplating, and oxidized to form a reversible resistance-switching material.

Another variable resistance material is amorphous silicon doped with V, Co, Ni, Pd, Fe or Mn, for example as described more fully in Rose et al., U.S. Pat. No. 5,541,869. Another class of material is taught by Ignatiev et al. in U.S. Pat. No. 6,473,332: these are perovskite materials such as $Pr_1$-$XCa_XMnO_3$ (PCMO), $La_1$-$XCa_XMnO_3$ (LCMO), $LaSrMnO_3$ (LSMO), or $GdBaCo_XO_Y$ (GBCO). Another option for this variable-resistance material is a carbon-polymer film comprising carbon black particulates or graphite, for example, mixed into a plastic polymer, as taught by Jacobson et al. in U.S. Pat. No. 6,072,716. Another example is to use carbon nanotubes as a reversible resistance-switching materials.

Another material is taught by Campbell et al. in U.S. Patent Application 2003/0045054, and by Campbell in U.S. Patent Application 2003/0047765. This material is doped chalcogenide glass of the formula $A_XB_Y$, where A includes at least one element from Group IIIA (B, Al, Ga, In, Ti), Group IVA (C, Si, Ge, Sn, Pb), Group VA (N, P, As, Sb, Bi), or Group VIIA (F, Cl, Br, I, At) of the periodic table, where B is selected from among S, Se and Te and mixtures thereof. The dopant is selected from among the noble metals and transition metals, including Ag, Au, Pt, Cu, Cd, Ir, Ru, Co, Cr, Mn or Ni. This chalcogenide glass (amorphous chalcogenide, not in as crystalline state) is formed in a memory cell adjacent to a reservoir of mobile metal ions. Some other solid electrolyte material could substitute for chalcogenide glass. Other variable resistance material includes amorphous carbon, graphite and carbon nanotubes. Other materials can also be used with the technology described herein.

More information about fabricating a memory cell using reversible resistance-switching material can be found in United States Patent Application Publication 2009/0001343, "Memory Cell That Employs A Selectively Deposited Reversible Resistance Switching Element and Methods of Forming The Same," incorporated herein by reference in its entirety. Additional information can also be found in U.S. patent application Ser. No. 12/339,313, "Reverse Set With Current Limit for Non-Volatile Storage," filed on Dec. 19, 2008, incorporated herein by reference in its entirety.

Reversible resistance-switching element 162 includes electrodes 172 and 174. Electrode 172 is positioned between reversible resistance-switching material 170 and conductor 168. In one embodiment, electrode 172 is made of platinum. Electrode 174 is positioned between reversible resistance-switching material 170 and steering element 164. In one embodiment, electrode 174 is made of Titanium Nitride, and serves as a barrier layer.

Steering element 164 can be a diode, or other suitable steering element that exhibits non-ohmic conduction by selectively limiting the voltage across and/or the current flow through the reversible resistance-switching element 162. In this manner, the memory cell 150 may be used as part of a two or three dimensional memory array and data may be written to and/or read from the memory cell 150 without affecting the state of other memory cells in the array. Steering element 164 may include any suitable diode such as a vertical polycrystalline p-n or p-i-n diode, whether upward pointing with an n-region above a p-region of the diode or downward pointing with a p-region above an n-region of the diode.

In some embodiments, steering element 164 may be a diode formed from a polycrystalline semiconductor material such as polysilicon, a polycrystalline silicon-germanium alloy, polygermanium or any other suitable material. For example, the steering element 164 can be a diode that includes a heavily doped n+ polysilicon region 182, a lightly doped or an intrinsic (unintentionally doped) polysilicon region 180 above the n+ polysilicon region 182, and a heavily doped p+ polysilicon region 186 above the intrinsic region 180. In some embodiments, a thin (e.g., a few hundred angstroms or less) germanium and/or silicon-germanium alloy layer (not shown), with about 10% or more of germanium when using a silicon-germanium alloy layer, may be formed on the n+ polysilicon region 182 to prevent and/or reduce dopant migration from the n+ polysilicon region 182 into the intrinsic region 180, as described, for example, in U.S. Patent Application Publication No. 2006/0087005, filed Dec. 9, 2005 and titled "DEPOSITED SEMICONDUCTOR STRUCTURE TO MINIMIZE N-TYPE DOPANT DIFFUSION AND METHOD OF MAKING," which is hereby incorporated by reference herein in its entirety. It will be understood that the locations of the n+ and p+ regions may be reversed. When steering element 164 is fabricated from deposited silicon (e.g., amorphous or polycrystalline), one embodiment may include a silicide layer being formed on the diode to place the deposited silicon in a low resistance state.

As described in U.S. Pat. No. 7,176,064, "Memory Cell Comprising a Semiconductor Junction Diode Crystallized Adjacent to a Silicide," which is hereby incorporated by reference herein in its entirety, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of the silicon diode during annealing). Lower resistance silicon thereby is provided. Similar results may be achieved for silicon-germanium alloy and/or germanium diodes.

Conductors 166 and 168 include any suitable conductive material such as tungsten, any appropriate metal, heavily doped semiconductor material, a conductive silicide, a conductive silicide-germanide, a conductive germanide, or the like. In the embodiment of FIG. 2, conductors 166 and 168 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 166 and 168 to improve device performance and/or aid in device fabrication.

Although the reversible resistance-switching element 162 is shown as being positioned above the steering element 164 in FIG. 2, it will be understood that in alternative embodiments, the reversible resistance-switching element 162 may be positioned below the steering element 164.

While FIG. 2 shows one example of a memory cell, no one particular type or structure of a memory cell is required for the technology disclosed herein. Many different types of memory cells can be used.

Figure 3:
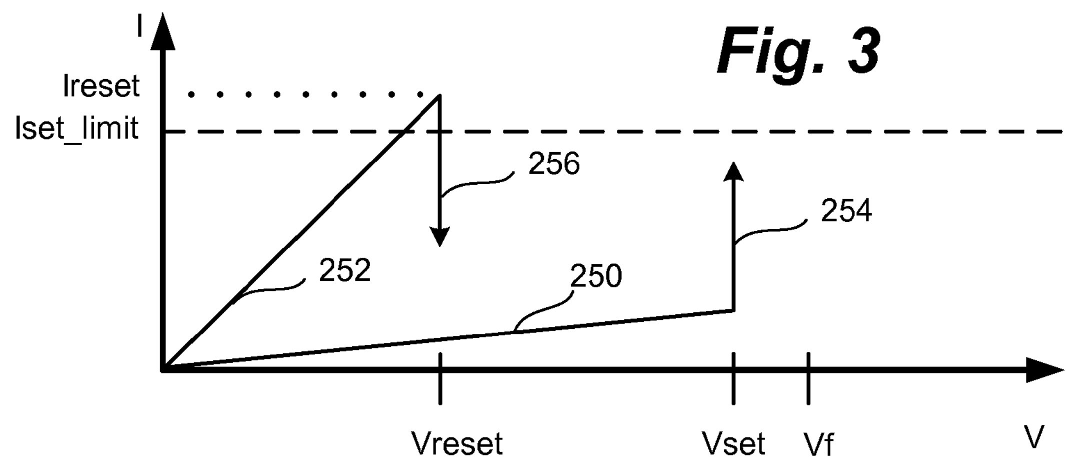
FIG. 3 is a graph depicting I-V characteristics of a reversible resistance-switching element.

FIG. 3 is a graph of voltage versus current for one example embodiment of a metal oxide reversible resistance-switching element. Line 250 represents the I-V characteristics of the reversible resistance-switching element when in the high-resistance state. Line 252 represents the I-V characteristics of the reversible resistance-switching element when in the low-resistance state. To determine which state the reversible resistance-switching element is in, a voltage is applied and the resulting current is measured. A higher measured current (see line 252) indicates that the reversible resistance-switching element is in the low-resistance state. A lower measured current (see line 250) indicates that the reversible resistance-switching element is in the high-resistance state. Note that other variations of a reversible resistance-switching element having different I-V characteristics can also be used with the technology herein.

While in the high-resistance state (see line 250), if the voltage Vset and sufficient current is applied to the memory cell, the reversible resistance-switching element will be SET to the low-resistance state. Line 254 shows the behavior when VSET is applied. The voltage will remain somewhat constant and the current will increase toward Iset_limit. At some point, the reversible resistance-switching element will be SET and the device behavior will be based on line 252. Note that the first time the reversible resistance-switching element is SET, Vf (the forming voltage) is needed to SET the device. After that, VSET can be used. The forming voltage Vf may be greater than VSET.

While in the low-resistance state (see line 252), if the voltage VRESET and sufficient current (Ireset) is applied to the memory cell, the reversible resistance-switching element will be RESET to the high-resistance state. Line 256 shows the behavior when VRESET is applied. At some point, the reversible resistance-switching element will be RESET and the device behavior will be based on line 250.

In one embodiment, Vset is approximately 5 volts, Vreset is approximately 3 volts, Iset_limit is approximately 5 uA and the Ireset current could be as high as 30 uA. In some embodiments, Vset can be lower than Vreset, the forming operation is not needed and/or the time needed to SET or RESET could be different.

The programming operations to SET and RESET the resistance of reversible resistance-switching material are known in the art. Many different implementations of circuits to SET and RESET the resistance of reversible resistance-switching material are known and can be used with the technology described herein. Examples of SET and RESET can be found in U.S. patent application Ser. No. 12/339,313, "Reverse Set With Current Limit for Non-Volatile Storage," filed on Dec. 19, 2008, incorporated herein by reference in its entirety; United States Patent Application 2007/0072360, incorporated herein by reference in its entirety; and United States Patent Application 2007/0008785, incorporated herein by reference in its entirety.

In some embodiments, circuits that provide, control and/or limit the current through a memory cell can be far away from the memory cell. This distance can be more of an issue for a monolithic three dimensional memory array where the control circuitry is on the substrate surface and the memory cells are on upper layers of the three dimensional memory array (as described above). Because of this distance, the conductive paths can get quite long which results in relatively large capacitances for the lines. In some cases, after a memory cell is SET, the capacitive charge on the lines will subsequently dissipate through the memory cell, which can cause extra current to pass through the reversible resistance-switching element. This extra current may cause the reversible resistance-switching element to SET to such a low resistance value that it is difficult or impossible to RESET the element. One proposed solution is to discharge the bit line and data bus during the SET operation so that after the SET have been achieved, no unwanted current will subsequently be driven through the memory cell. In this embodiment, the diode will be forward biased during the SET operation and Vset will be applied to the memory cell as a pulse (or other form). The Vset pulse will be shorter than the time needed to SET the reversible resistance-switching element so that the charge from the bit line and data bus will be needed to provide the extra charge not provided by the Vset pulse. For example, a voltage pulse will be used to charge the bit line connected to a memory cell. Due to its parasitic capacitance, the bit line will hold a charge. After being charged up, the bit line will be cut off from the voltage source so that the bit line is floating. The charge on the bit line will then dissipate through the memory cell to the word lines, causing the memory cell to SET.

In some implementations, the SET operation can be followed by a verify operation to see if the SET operation was successful. If not, the SET operation can be retried. In one example implementation, the verify operation is a read operation. Therefore, system control logic 130 will first cause one or more memory cells to be programmed (SET or RESET) and will then read all of the memory cells programmed. If the data read matches the data to be programmed, then the process is complete. If some of the data read does not match the data programmed (most likely because the programming was not successful), then the programming is repeated.

Figure 4A:
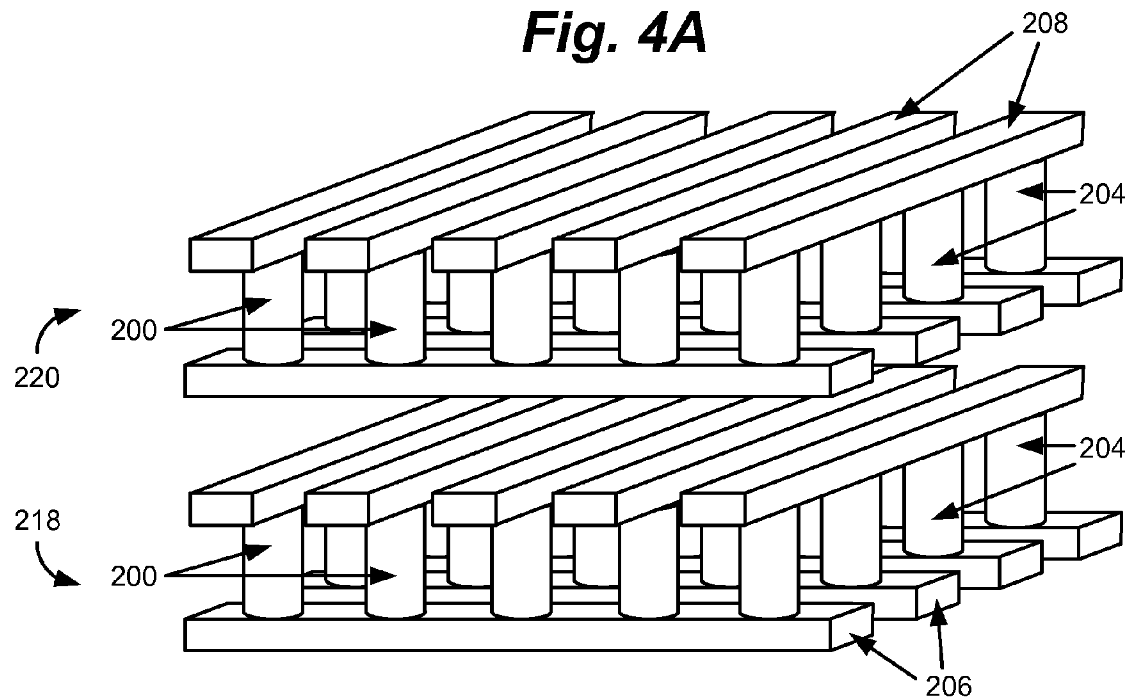
FIG. 4A is a simplified perspective view of a portion of one embodiment of a three-dimensional memory array.

Memory array 102 will comprise many memory cells. FIG. 4A is a simplified perspective view of a portion of a monolithic three dimensional array 102 that includes a first memory level 218 positioned below a second memory level 220. In the embodiment of FIG. 4A, each memory level 218 and 220 includes a plurality of memory cells 200 in a cross-point array. It will be understood that additional layers (e.g., an inter-level dielectric) may be present between the first and second memory levels 218 and 220, but are not shown in FIG. 4A for simplicity. Other memory array configurations may be used, as may additional levels of memory. In the embodiment of FIG. 4A, all diodes may "point" in the same direction, such as upward or downward depending on whether p-i-n diodes having a p-doped region on the bottom or top of the diode are employed, simplifying diode fabrication. Memory cells 200 can be the same as or different than memory cell 150.

Figure 4B:
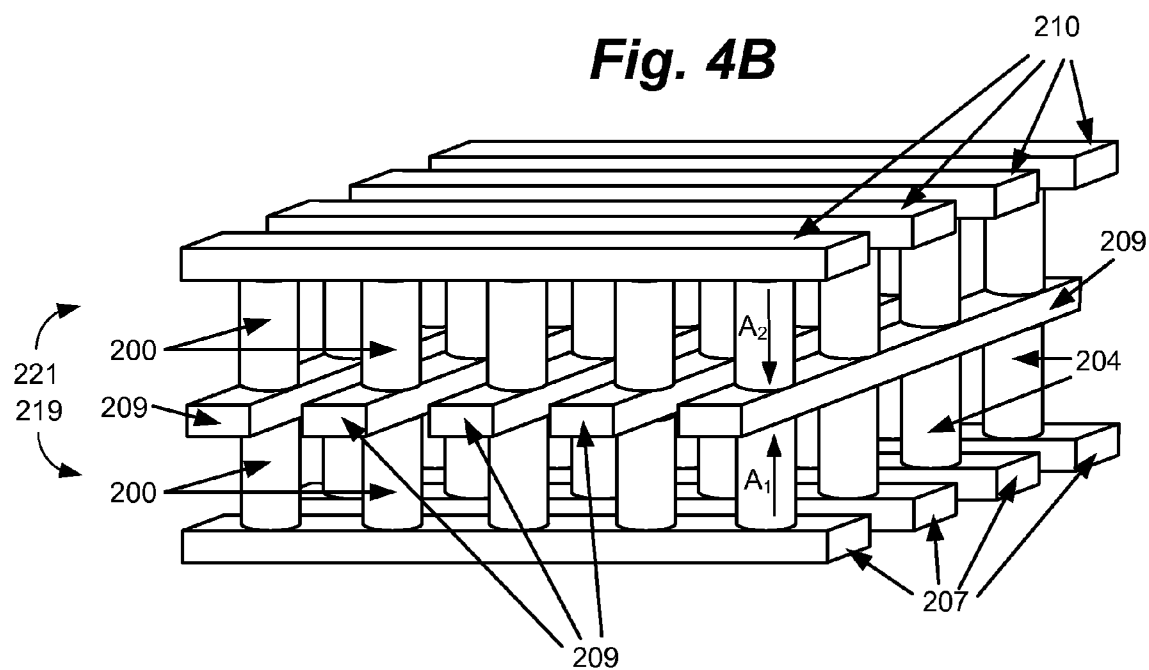
FIG. 4B is a simplified perspective view of a portion of one embodiment of a three-dimensional memory array.

FIG. 4B is a simplified perspective view of a portion of a second embodiment of a monolithic three-dimensional array 102 that includes a first memory level 219 positioned below a second memory level 221. The memory array of FIG. 4B includes a plurality of memory cells 200. With respect to first memory level 219, memory cells 200 are between and connect to a set of bit lines 207 and a set of word lines 209. With respect to second memory level 221, memory cells 200 are between and connect to a set of bit lines 210 and word lines 209. The upper conductors of a first memory level may be used as the lower conductors of a second memory level that is positioned above the first memory level, as shown in FIG. 4B. Additional information is described in U.S. Pat. No. 6,952,030, "High-Density Three-Dimensional Memory Cell," which is hereby incorporated by reference herein in its entirety.

In the embodiment of FIG. 4B, the diodes (or other steering devices) on adjacent memory levels preferably point in opposite directions, as described in U.S. Patent Application Publication No. 20070190722, filed Mar. 27, 2007 and titled "Method to Form Upward Pointing P-I-N Diodes Having Large And Uniform Current," which is hereby incorporated by reference herein in its entirety. For example, the diodes of the first memory level 219 may be upward pointing diodes as indicated by arrow $A_1$ (e.g., with p regions at the bottom of the diodes), while the diodes of the second memory level 221 may be downward pointing diodes as indicated by arrow $A_2$ (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

In one embodiment of a monolithic three-dimensional memory array, the bit lines are arranged in a first direction and the word lines are arranged in a second direction perpendicular to the bit lines. In a monolithic three-dimensional memory array with additional layers of memory cells, there would be additional layers of bit lines and word lines. The supporting circuitry (e.g., column control circuitry 110, row control circuitry 120, and system control logic 130) are arranged on the surface of the substrate with the memory array fabricated above the supporting circuitry.

Figure 5:
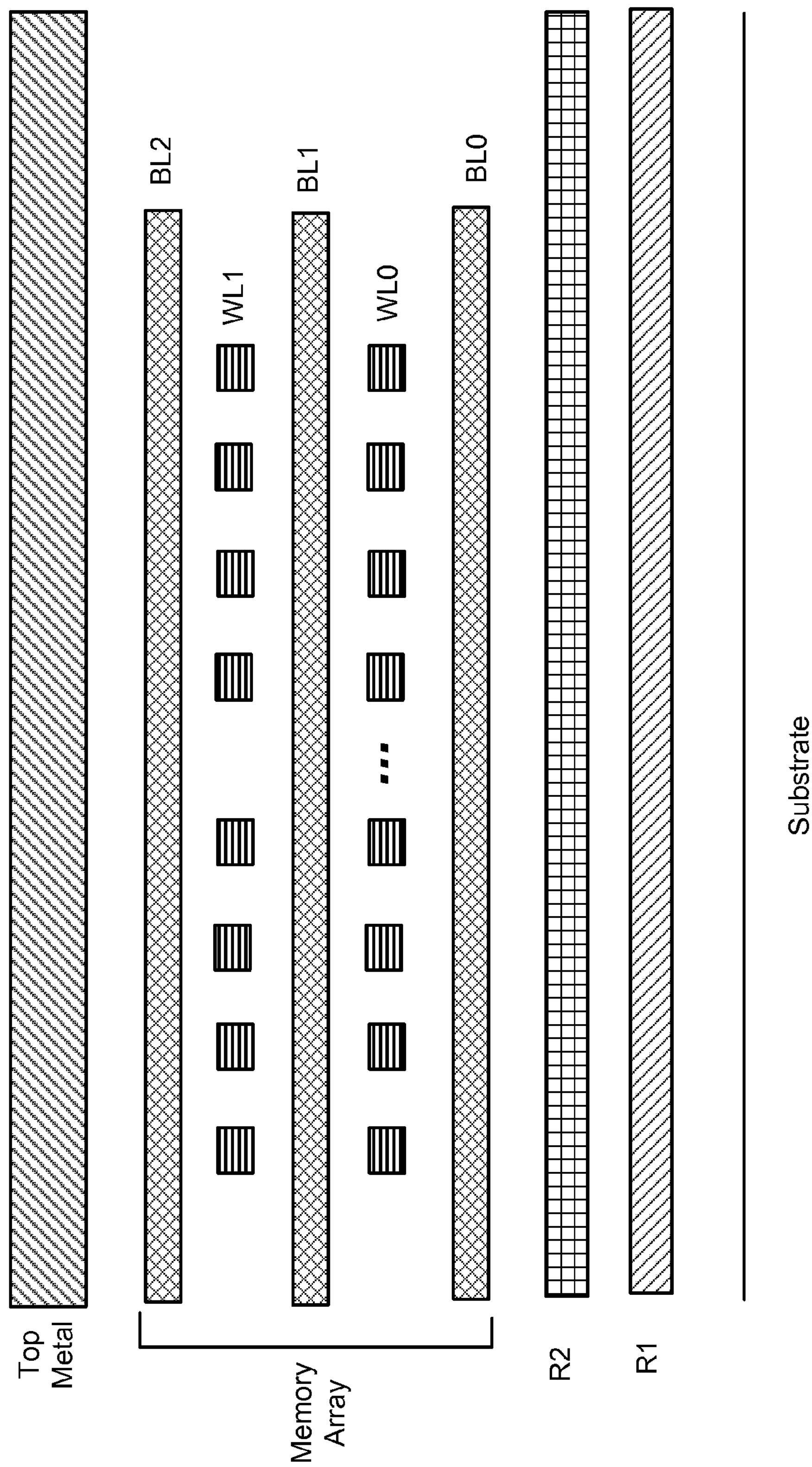
FIG. 5 depicts a subset of the layers of one embodiment of a three-dimensional memory.

FIG. 5, which depicts various layers of an integrated circuit, shows the Memory Array positioned above the Substrate. The Memory Array includes bit line layers BL0, BL1 and BL2, and word line layers WL0 and WL1. In other embodiments, additional bit line and word line layers can also be implemented. An integrated circuit implementing a semiconductor memory system also includes multiple metal layers used for routing signals between different components of the support circuitry, and between the supporting circuitry and the bit lines and word lines. These metal layers are arranged above the support circuitry that is implemented on the surface of the Substrate and below the Memory Array. FIG. 5 shows two metal layers R1 and R2 used for routing; however, other embodiments can include more or less than two metal layers. In one example, these metal layers R1 and R2 are formed of Tungsten (about 1.5 ohm/squre), which has both a relatively high resistance and high capacitance.

Positioned above the memory array can be one or more metal layers used for routing signals between different components of the memory system. FIG. 5 shows one such metal layer above the memory array, labeled as the Top Metal layer. In one example, the top metal layer is formed of aluminum or copper (about 0.05 ohm/squre), which has a smaller resistance and capacitance than layers R1 and R2. Metals layers R1 and R2 are not implemented using the same materials as used for the Top Metal because the metal used for R1 and R2 needs to withstand the processing steps for fabricating the memory array on top of R1 and R2.

Vias can be added to make connections between adjacent metal layers. Zias can be added to make connections between layers that are not adjacent. A zia is a multi-layer via and can connect more than 2 layers (in which case the zia looks like a staircase).

Figure 6:
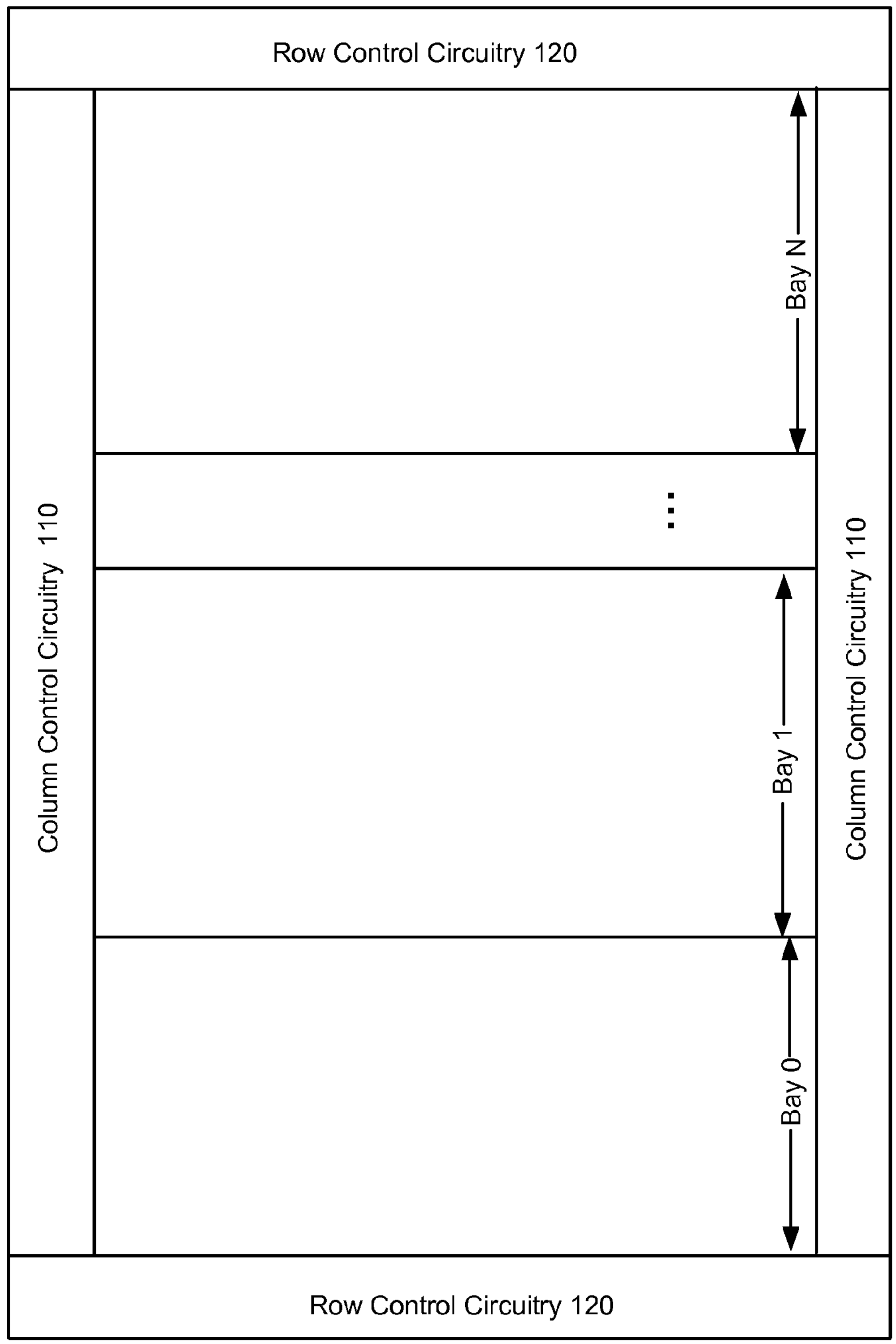
FIG. 6 depicts a logical view of one embodiment of a memory array.
Figure 7:
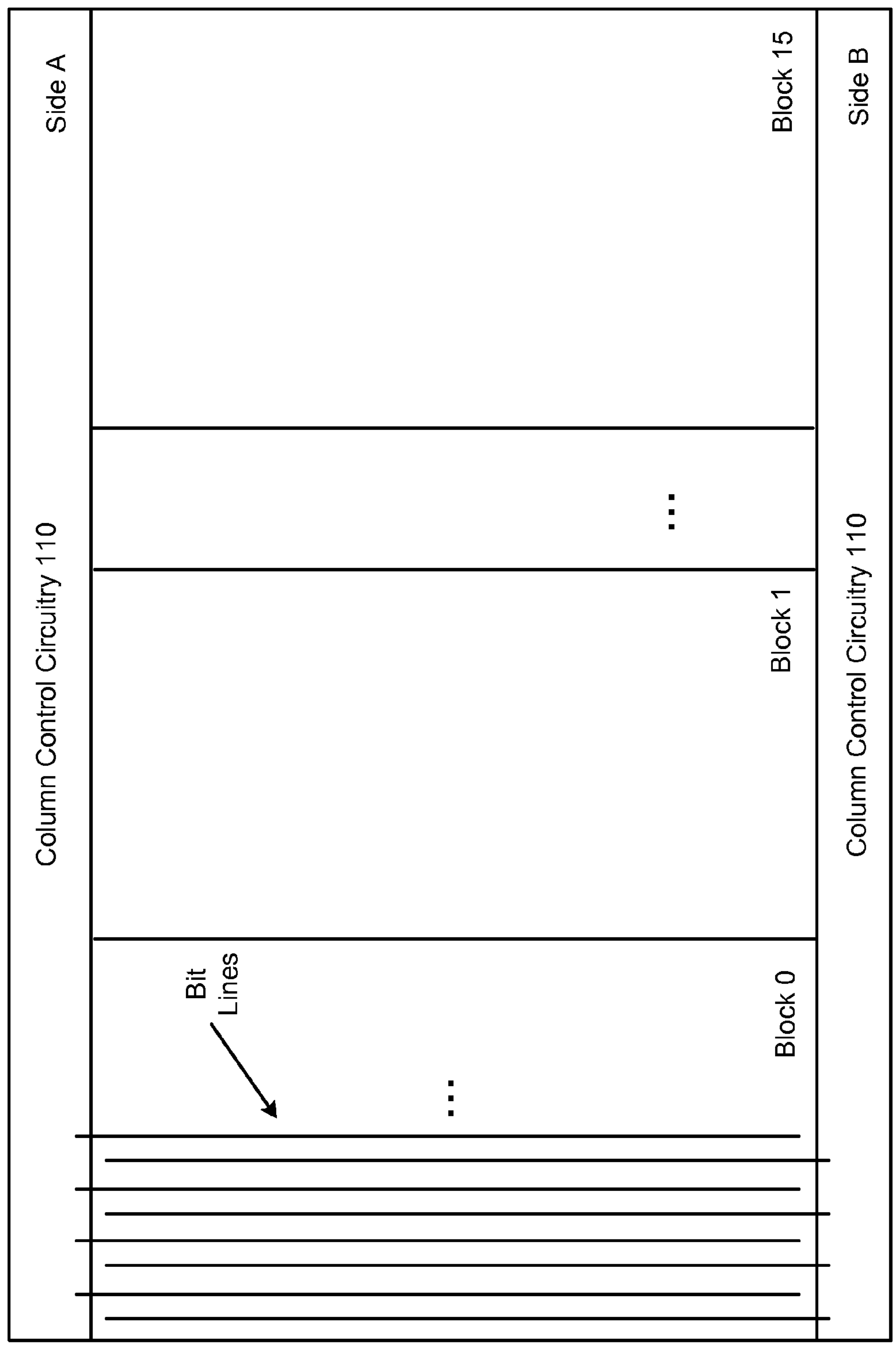
FIG. 7 depicts a logical view of one embodiment of a bay in a memory array.

Memory array 102 is subdivided into bays, and each bay can (optionally) be divided into a number of blocks. FIG. 6 shows a logical view of memory array 102 divided into bays (e.g., Bay 0, Bay 1, . . . Bay N). The number of bays can be different for different implementations. Some embodiments may use only one bay. FIG. 7 shows one bay (e.g., Bay 0) divided into blocks (Block 0-Block 15). In one embodiment, there are 16 blocks in a bay. However, other embodiments can use different numbers of blocks.

A block is a contiguous group of memory cells having contiguous word lines and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. An integrated circuit may include one or more than one memory array.

FIG. 7 shows a subset of the Bit Lines for Block 0. The substrate is wider than the memory array; therefore, portions of the Column Control Circuitry 110 can protrude out from under the memory array to facilitate connections using zias and vias to R1, R2, Top Metal, and the bit lines. Column Control Circuitry 110 (including decoders and sense amplifiers) is divided into two sets of circuits, with each set of circuits being located on opposite sides (e.g. Side A and Side B) of the integrated circuit so that one set of circuits of Column Control Circuitry 110 protrudes out from a first side (Side A) of the memory array and the second set of circuits of Column Control Circuitry 110 protrudes out from the opposite side (Side B) of the memory array. Half of the bit lines for a block are connected to one set of circuits of Column Control Circuitry 110 on side A and the other half of the bit lines for a block are connected to the second set of circuits of Column Control Circuitry 110 on side B. In one embodiment, these two sets of bit lines are interleaved so that every other bit line connects to Column Control Circuitry 110 on side A and the intervening bit lines connect to Column Control Circuitry 110 on side B. There could be cases in which two neighboring bit lines are picked from side A and the next 2 from side B. This depends on process.

In one embodiment, there are two sense amplifiers located below each block, for example, on the surface of the substrate. One of the two sense amplifiers are for bit lines that connect to Column Control Circuitry 110 on side A and the other sense amplifier is for bit lines that connect to Column Control Circuitry 110 on side B. In the embodiment that includes 16 blocks in a bay, there are 32 sense amplifiers for a bay with sixteen for each side (side A and side B). In one embodiment, one property of a bay is that all of the blocks in the bay share the same 32 sense amplifiers. That means that 32 memory cells in a bay can be simultaneously selected for programming or reading. Thus, the memory system includes circuits for selecting the 32 memory cells and lines for routing signals between the 32 selected memory cells and the sense amplifiers.

In previous systems, global routing lines for routing signals between the 32 selected memory cells and the sense amplifiers were implemented in metals layers R1 or R2, which have a relatively large resistance and capacitance. To reduce overall resistance and capacitance, some previous designs have implemented half of the global routing lines for routing signals between the 32 selected memory cells and the sense amplifiers in R1 (or R2) and the other half of the global routing lines for routing signals between the 32 selected memory cells and the sense amplifiers implemented in Top Metal. While this scheme does reduce resistance and capacitance, the reduction is not enough to allow for high speed operation. In previous implementations, each one of the global routing lines were touching all decoding transistor drains, which increase the total capacitance associated to the line.

To further reduce resistance and capacitance in data lines between selected memory cells and the sense amplifiers, a sectional data line scheme can be used. Local data lines are provided for each section, where a section can include one, two, four, or another number of blocks. Selection circuits are used to connect the local data lines to the appropriate bit lines. Sense amplifier outputs are provided to global data lines across all bays. Selection circuits are used to connect the global data lines to the appropriate local data lines.

Figure 8:
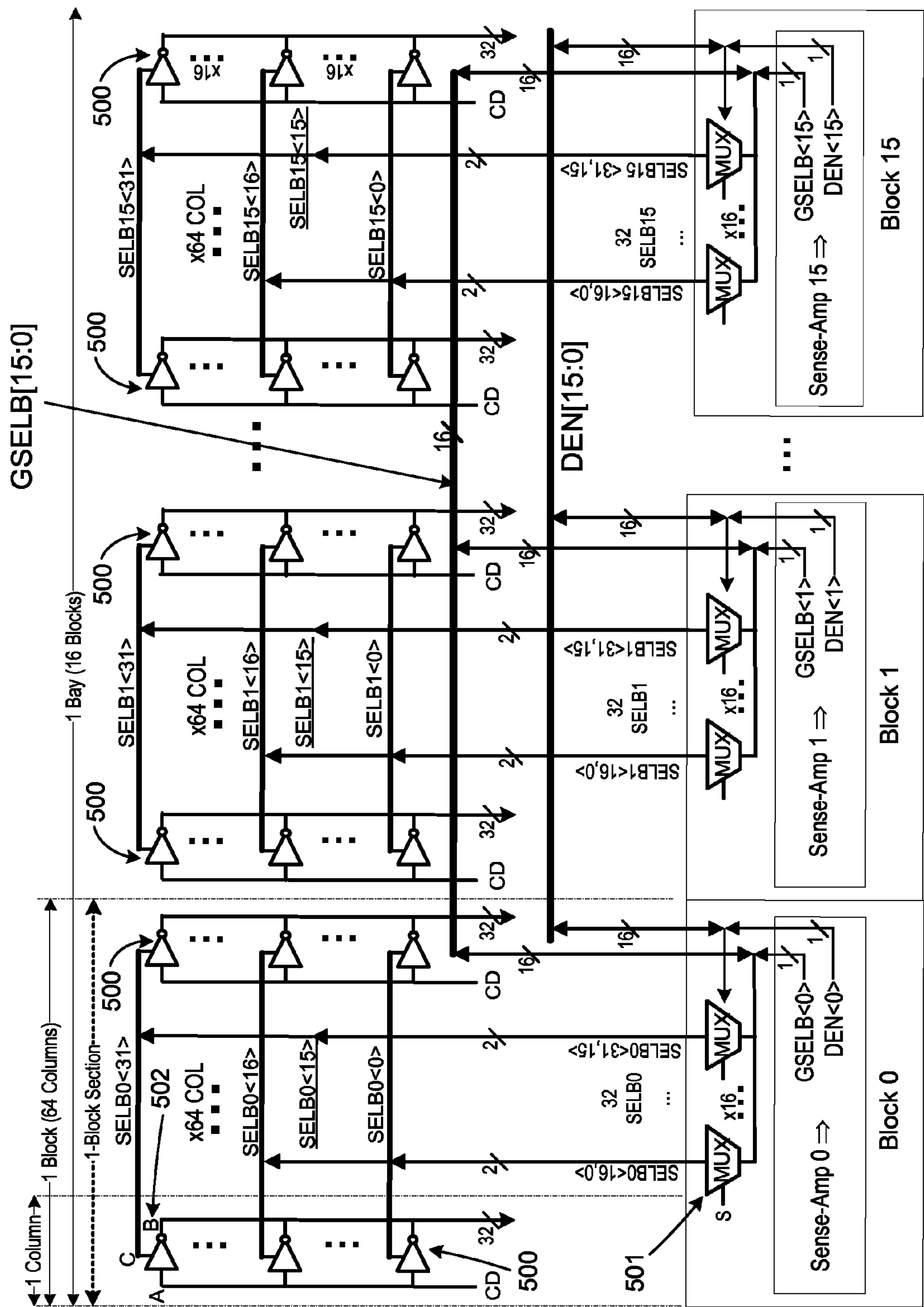
FIG. 8 is a schematic diagram of one embodiment of the data lines and selection circuits for connecting bit lines to the column control circuitry via the data lines.

FIG. 8 is a schematic diagram that depicts a portion of the routing signals and selection circuits for one embodiment of Column Control Circuitry 110 that implements a sectional data line scheme. In this embodiment, there are 16 blocks in a bay. Depicted are portions of three blocks: Block 0, Block 1 and block 15. Each block has 64 columns of selection circuits 500 for electrically connecting bit lines to sense amplifiers on one side of the array (e.g. side A FIG. 7) and 64 columns of selection circuits for connecting to bit lines to sense amplifiers on the other side of the array (e.g. side B of FIG. 14). FIG. 8 only shows the 64 columns of selection circuits 500 for connecting to side B. Each block, therefore, has 64 columns× 32 bit lines×2 (top and bottom)=4096 bit lines for every block. In one embodiment, the three dimensional memory array includes four layers, with 1024 bit lines per layers. Other arrangements of the decoding circuits, bit lines and layers can also be used.

In the embodiment of FIG. 8, each block has its own set of local data lines. For example, block 0 includes SELB0<31:0>, block 1 includes SELB1<31:0>, . . . block 15 includes SELB15<31:0>. In one embodiment, the local data lines SELB0<31:0>, SELB1<31:0>, . . . SELB15<31:0> are implemented in metal layer R1 under their respective block, and only run the width of the respective block. Local data lines SELB0<31:0>, SELB1<31:0>, . . . SELB15<31:0> correspond to the data bus of FIGS. 5, 8 and 10. Selection circuits 500 for a particular column are used to selectively connect the 32 bit lines for that same column to 32 respective local data lines (SELB0<31:0>, SELB1<31:0>, . . . or SELB15<31:0>). As can be seen from FIG. 8, each of the selection circuits 500 receives a selection signal CD from column decoders 112 and a bit line connection from one of the 32 bit lines associated with the column. Based on the selection input from column decoder 112, the selection circuit 500 will connect or disconnect the bit line to a respective one of the local data lines (e.g., SELB0<31:0>, SELB1<31:0>, . . . SELB15<31:0>).

FIG. 9 is a schematic diagram showing the details of one embodiment of selection circuits 500. For example purposes, one of selection circuits 500 has been individually labeled by reference number 502 in FIG. 8. Selection circuit 502 includes terminals A, B and C. The schematic diagram of FIG. 9 also shows terminals A, B and C. Terminal A is connected to column decoder 112 so that column decoder 112 can send a selection signal CD to control selection circuit 502. Terminal B is connected to a respective bit line. Terminal C is connected to a respective local data line (e.g., one of SELB0<31:0>, SELB1<31:0>, . . . or SELB15<31:0>). FIG. 9 also shows a terminal D, which is a global line for unselected bit lines. For ease of reading, FIG. 8 does not show the connection to all of the terminal D's of the selection circuits 500; however, one skilled in the art would understand that all of the terminal D's are connected to a common unselected bit line signal value. The selection circuits electrically connect a bit line to a local data line so that the bit line can electrically communicate with the local data line. When the selection circuit is configured to not electrically connect a bit line to a local data line, then the bit line cannot communicate with the local data line despite that both the bit line and data line are still physically connected to the selection circuit.

The selection circuits each include two connected transistors 620 and 622, and capacitor 624. Capacitor 624 is not an actual physical capacitor in the circuit. Instead, capacitor 624 represents the source-to-well parasitic capacitance. Terminal A connects the column decoder 112 to the gates of transistors 620 and 622. Based on the signal at terminal A, the bit line at Terminal B will be in communication with the respective local data line (e.g., one of SELB0<31:0>, SELB1<31:0>, . . . or SELB15<31:0>) at Terminal C or the unselected bit line signal at terminal D. Each of the selection circuits 500 will be fabricated on the surface of the substrate with connections to bit lines using zias and connections to column decoders 112, local data lines and unselected bit line signals using metal layers R1 and/or R2.

Looking back at FIG. 8, column decoders 112 choose one column and send to that chosen column a selection indication on the appropriate selection signal line CD so that the chosen column connects the respective 32 bit lines to the local data lines (SELB0<31:0>, SELB1<31:0>, . . . or SELB15<31:0>). Each block has its own set of sixteen 2:1 multiplexers MUX (e.g., MUX 501) that are associated with the block and located on the substrate below the block. Each set of 32 local data lines (SELB0<31:0>, SELB1<31:0>, . . . or SELB15<31:0>) are connected to a respective set of sixteen 2:1 multiplexers (MUX) for that respective block. For example, in block 0 the first multiplexer receives SELB0<0> and SELB0<16>, the second multiplexer receives SELB0<1> and SELB0<17>, . . . the sixteenth multiplexer receives SELB0<15> and SELB0<31>. Each of the multiplexers in a block receive a common selection signal (e.g., signal S) from column decoders 112 so that 16 of the 32 local data lines are selected. In one embodiment, the same selection signal S is provided to all of the multiplexers (MUX) for a block (or bay) so that either (for example) SELB0<15:0> are selected or SELB0<16:31> are selected. In one embodiment, the multiplexers include the ability to bias the unselected SELB.

The sixteen selected local data lines are connected to global data lines GSELB<15:0> so that a memory operation (e.g. Read, SET, RESET) is performed on the selected memory cells. For example, SELB0<0> is selectively connected to GSELB<0>, SELB0<1> is selectively connected to GSELB<1>, etc. or SELB0<16> is selectively connected to GSELB<0>, SELB0<17> is selectively connected to GSELB<1>, etc. The global data lines GSELB<15:0> are implemented in Top Metal and connections between global data lines GSELB<15:0> and multiplexers (MUX) are made using zias (or vias). The global data lines GSELB<15:0> run across the entire Bay, with each Bay having its own set of global data lines. To reduce coupling between global data lines, various forms of Top Metal isolation can be used.

Each of the global data lines GSELB<15:0> are connected to one of the sense amplifiers. For example, the output Sense-Amp0 of the sense amplifier located underneath block 0 is connected to GSELB<0>, the output Sense-Amp1 of the sense amplifier located underneath block 1 is connected to GSELB<1>, . . . and the output Sense-Amp15 of the sense amplifier located underneath block 15 is connected to GSELB<15>. Thus, the output of a particular sense amplifier is connected to a global data line, then to a local data line by way of a multiplexer, and then to a bit line by way of a selection circuit 500. Because the global data lines are implemented in Top Metal, and Top Metal has significantly less resistance than metal layers R1 and R2, the signal path from the sense amplifiers to the memory cells has a lower resistance. Capacitance is also reduced because the number of transistors that are "off" and are touched by the decoding line is reduced. The total parasitic capacitance of the bit line drivers (source-to-well parasitic cap) is reduced by having a sectional data-line, by reducing number of bit line drives for each data-line (SELB).

As mentioned above, FIG. 8 only shows the connection paths to sense amplifiers on one side (e.g., side B) of the blocks. Thus, there is another set of local data lines for each block, another set of global data lines for each bay and another set of sense amplifiers for each bay in addition to that which is depicted for FIG. 8. Therefore, a selected block is associated with 64 selected bit lines that are connected to 64 local data lines, for which 32 multiplexers choose 32 local data lines to connect to 32 global data lines. The 32 global data lines are connected to 32 sense amplifiers associated with that particular bay.

The choice of 16 blocks in a bay, 64 bit lines in a column, using 64 local data lines, and 32 global data lines is for one set of embodiments. In other embodiments, different numbers of each item can be used. Additionally, the number of local data lines can be non-binary (like e.g., 48 or 96).

If the 2:1 multiplexers (MUX) of a block are traditional multiplexers and share a common selection signal S, then in one embodiment the memory operation being performed is first performed for a first set of sixteen select lines. After the memory operation completes for the first set of sixteen select lines, then the common selection signal S is toggled and the memory operation (same or different memory operation) is performed for the second set of sixteen select lines. For example, when performing a memory operation (e.g. Read, SET, RESET), the common selection signal S is set so that the multiplexers first choose SELB0<0>, SELB0<1>, . . . SELB0<15>. Therefore, the memory operation is performed (during a first pass) on those memory cells connected to bit lines that have been connected (via selection circuits 500) to local data lines SELB0<0>, SELB0<1>, . . . SELB0<15>. After all 16 memory cells have completed the memory operation, common selection signal S is toggled so that the multiplexers then choose SELB0<16>, SELB0<17>, . . . SELB0<31> and the memory operation is performed (during a second pass) on those memory cells connected to bit lines that have been connected (via selection circuits 500) to local data lines SELB0<16>, SELB0<17>, . . . SELB0<31>. If one of the sixteen memory cells of the first pass is slow to complete the memory operation, then the start of the second pass is delayed for all sixteen memory cells. In some embodiments, multiple bays (e.g. x bays) are operated on in parallel and share a common selection signal, so that if any one of the 16(x) memory cells is slow to complete the memory operation, then the start of the second pass is delayed for all 16(x) memory cells. As the number of memory cells operated on in parallel increases, the potential for delay also increases.

To reduce the above-described delay, the multiplexer is designed to be able to independently switch connections when its associated memory cell has completed the memory operation. For example, consider the performance of a memory operation so that during the first pass, multiplexers first choose SELB0<0>, SELB0<1>, . . . SELB0<15>. When the selected memory cell connected to the bit line that is coupled to SELB0<0> completes the memory operation, the multiplexer that selects between SELB0<0> and SELB0<16> will independently switch to connected SELB0<16> to GSELB<0> without waiting for the selected memory cells connected to SELB0<1>, SELB0<2>, . . . SELB0<15> to complete the memory operation. Any one of the sixteen multiplexers can independently change from the first phase to the second phase (e.g., change selections of SELB inputs to connect to GSELB) without waiting for the other fifteen (or more) multiplexers to change and without waiting for the common selection signal S to change. After the second phase completes, the multiplexers will wait for all sixteen memory cells to complete the second phase prior to the subsequent action, which may typically be changing the column address and performing the same (or different) type of memory operation in the next column.

To enable the multiplexers to change data connections independently as described above, the sense amplifiers will send a Data Enable signal (DEN) to the multiplexers to indicate that it should switch its selection because the first memory cell (the first phase) has completed the memory operation. Each sense amplifier will output one Data Enable signal (DEN) that must be routed to one multiplexer for each block. For example, Sense Amplifier 0 (Sense-AMP 0) will send its Data Enable signal (DEN) to the multiplexers that switch between SELB0<16,0>, Sense Amplifier 1 (Sense-AMP 1) will send its Data Enable signal (DEN) to the multiplexers that switch between SELB0<17,1>, . . . Sense Amplifier 15 (Sense-AMP 15) will send its Data Enable signal (DEN) to the multiplexers that switch between SELB0<31,15>. To route these Data Enable signal, the circuit of FIG. 8 includes a Data Enable bus DEN<15:0>, where DEN<0> is from Sense Amplifier 0 (Sense-AMP 0), DEN<1> is from Sense Amplifier 1 (Sense-AMP 1), . . . DEN<0> is from Sense Amplifier 15 (Sense-AMP 15). The schematic of FIG. 8 shows each sense amplifier transmitting its one bit DEN to the DEN<15:0> bus. Also, each of the 16 bits of the bus are connected to the respective multiplexer so that each multiplexer can be independently switched from its first phase to its second phase.

FIG. 10 is a schematic diagram of a portion of a sense amplifier and page register (both part of sense amplifiers 118) that shows the logic for generating the appropriate Data Enable signal (DEN). Since sense amplifiers are well known in the art, only the additional portion of the sense amplifier that generates the Data Enable signal (DEN) is depicted. The sense amplifier includes a Sense Amp Driver (SA Driver), a Sense Amp Detector (SA Detector) and a Data Enable Generator (DATA_EN Generator). The Sense Amp Driver is connected to a global data line (GSELB) and drives signals (e.g., VWR) on bit lines (via a global data line GSELB, a multiplexer and a local data line SELB) using transistor 702. The Sense Amp Detector includes a comparator circuit 700 that detects the status of the memory operation by comparing the connected global bit line to a reference (e.g., Vref). The Data Enable Generator generates the respective Data Enable signal DEN to signal that the first of the two bits connected to a multiplexer has completed the memory operation. When the Sense Amp Detector detects the completion of a memory operation (e.g., completion of a SET or RESET), the output signal DETECTED is asserted and sent to AND gate 704 and inverter 706 of Data Enable Generator. This causes a positive pulse to be output from AND gate 704. The output of AND gate 704 is connected to the input of NOR gate 708. The other input of NOR gate 708 is the DATA signal from the Page Register. Assuming the DATA signal is at logic 0, the positive pulse from AND gate 704 results in a negative pulse out of NOR gate 708.

The output signal DETECTED is also sent to the Page Register. The Page Register outputs three signals depicted in FIG. 10: Sense Amplifier Enable (SAEN), Bit Line Pre-Charge (BLP) and Data. SAEN is used to enable the Sense Amp Driver. BLP is used to start the pre-charging of a bit line. DATA indicates whether the next bit needs to be programmed (DATA=0) or that the next bit does not need to be programmed (DATA=1). If the next bit does not need to be programmed, then the output of NOR gate 708 is forced to zero; therefore, there will be no pulse. The signal DEN is the respective bit of DEN<15:0> of FIG. 8.

Figure 11:
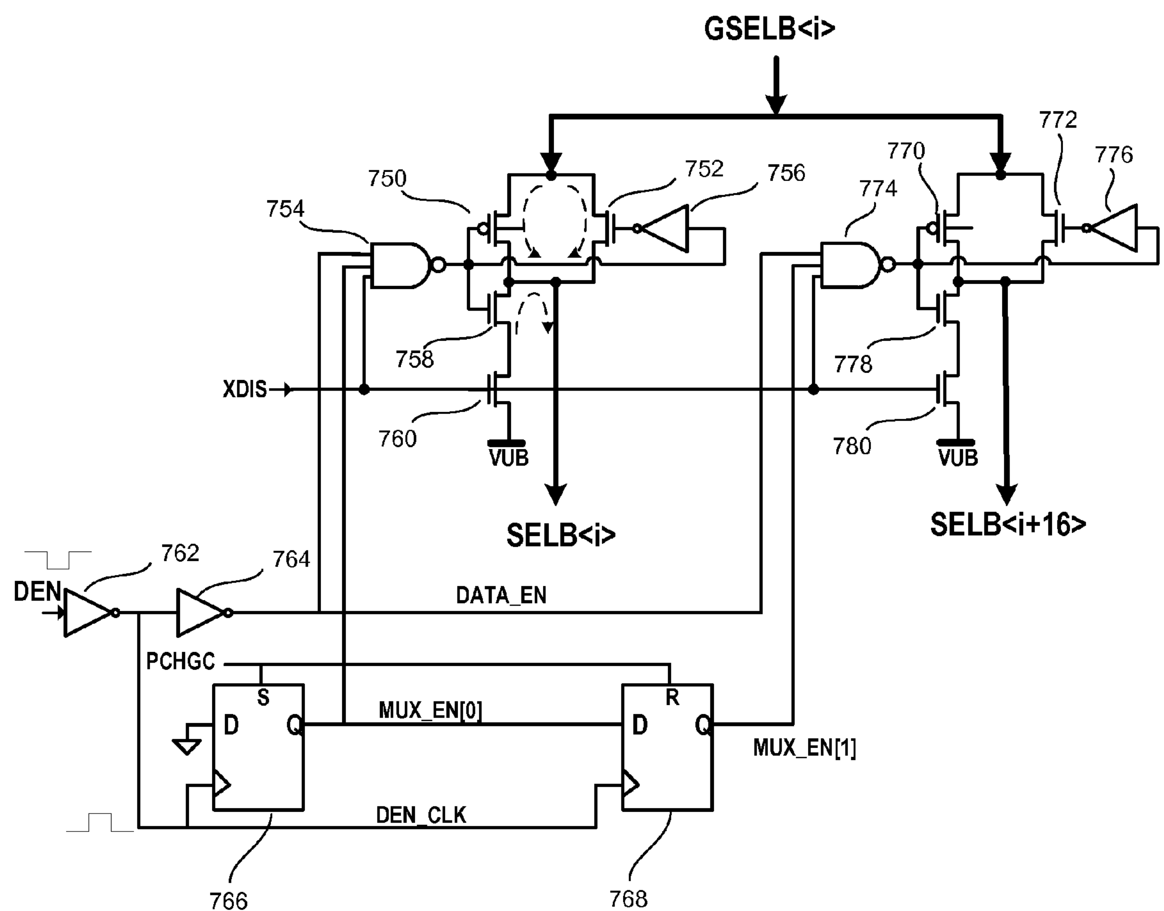
FIG. 11 is a schematic diagram of one embodiment of a multiplexer circuit.

FIG. 11 is a schematic of a circuit for the 2:1 multiplexers (MUX) depicted in FIG. 8. The respective global data line GSELB<i> is connected to transistors 750, 752, 770 and 772. Transistors 750 and 752 are also connected to the first of the two local data lines SELB<i>. Thus, transistors 750 and 752 provide a path between the global data line GSELB<i> and the local data line SELB<i>. In addition to the connection to GSELB<i>, transistors 770 and 772 are also connected to the second local data line SELB<i+16>. Thus, transistors 770 and 772 provide a path between global data line GSELB<i> and the second local data line SELB<i+16>. The gate of transistor 750 is connected to the output of NAND gate 754. The gate of transistor 752 is connected to the output of inverter 756. The input of inverter 756 is connected to the output of NAND gate 754. The output of NAND gate 754 is also connected to the gate of transistor 758. Transistor 758 is connected between local date line SELB<i> and transistor 760. Transistor 760 is connected between transistor 758 and the voltage VUB. The output of NAND gate 774 is connected to the gate of transistor 770, the input of inverter 776 and the gate of transistor 778. The output of inverter 776 is connected to the gate of transistor 772. Transistor 778 is connected between local data line SELB<i+16> and transistor 780. Transistor 780 is connected between transistor 778 and the voltage VUB.

The signal DEN, from the respective sense amplifier (see FIG. 10), is provided to inverter 762. The output of inverter 762 is provided to inverter 764. The output of inverter 764 is connected to the input of NAND gate 754. Discharge signal XDIS is connected to an input of NAND gate 754, the gate of transistor 760, an input of NAND gate 774 and the gate of transistor 780. XDIS is a global signal and for the purpose of the processes described herein, XDIS can always be considered as a solid logic "1." The output of inverter 762 is also connected to the clock inputs for D flip-flop 766 and D flip-flop 768. The input of D flip-flop 766 is grounded. The output of D flip-flop 766 is connected to the input of D flip-flop 768 and to the input of NAND gate 754. The output of D flip-flop 766 is labeled MUX_EN<0>. The output of D flip-flop 768, labeled as MUX_EN<1>, is connected to the input of NAND gate 774. The set input of D flip-flop 766 and the reset input of D flip-flop 768 are connected to program change column signal (PCHGC).

D flip-flops 766 and 768 operate as a two bit shift register to generate the two MUX enabled signals MUX_EN<0> and MUX_EN<1>. High states of the respective multiplexor enable signals will enable one of the two local data line inputs, SELB<i> and SELB<i+16>, of the multiplexor to be connected to the one global data line GSELB<i>. When the multiplexor enable signal MUX_EN<0> is at logic 0, NAND gate 754 will output logic 1, which will turn off the respective set of transistors 750/752 to cut off the respective local data line SELB<i> from the global data line GSELB<i>. When multiplexor enable signal MUX_EN<0> is at logic 1, NAND gate 754 can be at logic 0 to turn on transistors 750/752 to provide a path between the respective local data line SELB<i> and global date line GSELB<i>. When the multiplexor enable signal MUX_EN<1> is at logic 0, NAND gate 774 will output logic, 1 which will turn off transistors 770/772 to cut off local data line SELB<i+16> from global data line GSELB<i>. When multiplexor enable signal MUX_EN<1> is at logic 1, NAND gated 774 can be at logic 0 to turn on the respective pairs of transistors 770/772 to provide a path between local data line SELB<i+16> and global date line GSELB<i>.

As discussed above, when the next phase of a particular program operation does not require data to be written, or no memory operation needs to be performed, the DATA signal (see FIG. 10) from the Page Register will be at logic level 1, which will force the output of the NOR gate 708, and the signal DEN, to be at logic 0. When the DEN signal is at constant zero, NAND gates 754 and 774 will output logic 1 which will turn off the pairs of transistors (750/752 and 770/772) to isolate global data line GSELB<i> from both local data lines SELB<i> and SELB<i+16>. When the output of the NAND gates 754 and 774 are logic 1, transistors 758 and 778 turn on to provide the voltage VUB to the local data lines SELB<i> and SELB<i+16> (as XDIS is fixed at logic 1 to turn on transistors 760 and 780).

When starting to program the first phase for a column (SET or RESET the first bit of the two bits connected to a multiplexor), the signal PCHGC will be asserted to set D flip-flop 766 to logic 1 and reset D flip-flop 768 to logic 0. This will connect GSELB<i> to SELB<i> and isolate GSELB<i> from SELB<i+16>. When the SA Detector (see FIG. 10) asserts the DETECTED signal (e.g., in response to detecting the successful program operation), a negative pulse will be generated on DEN. The low status of DEN will disable the data MUX, thereby isolating global data line GSELB<i> from both local data lines SELB<i> and SELB<i+16>. The DETECTED signal is also provided to the Page Register, which will enable the next bit of data to be programmed (by properly controlling the DATA signal). In response thereto, the page register will generate SAEN and BLP to the sense amplifier driver independently (e.g. ignoring the status of other sense amplifiers). The low pulse on DEN will be provided to the circuit of FIG. 11 at the input of inverter 762. The low pulse of DEN from the sense amplifier will shift the MUX enable from MUX_EN<0> to MUX_EN<1>. If DEN is kept low, both local data lines are at VUB (e.g. 0.5 v) and the global data line GSELB<i> is isolated from the local data line. Therefore, the global data line GSELB<i> can be kept at relatively high voltage for the next set of data in the next column. If a pulse is provided at the input of inverter 762, then when DEN goes back high at the end of the pulse, the second input of the multiplexer SELB<i+16> is selected so that GSELB<i> is in communication with SELB<i+16> and the second phase of the memory operation can be performed.

One advantage of this scheme is that the global data line need not be completely discharged before the next memory operation. The global data line GSELB<i> is isolated from the local data line before the next write operation. Therefore, the sense amplifier is not needed to discharge the global data line. Instead, the sense amplifier can keep the global data line GSELB<i> at a relatively high voltage (e.g. Vsafe) as described below with respect to FIG. 12.

Figure 12:
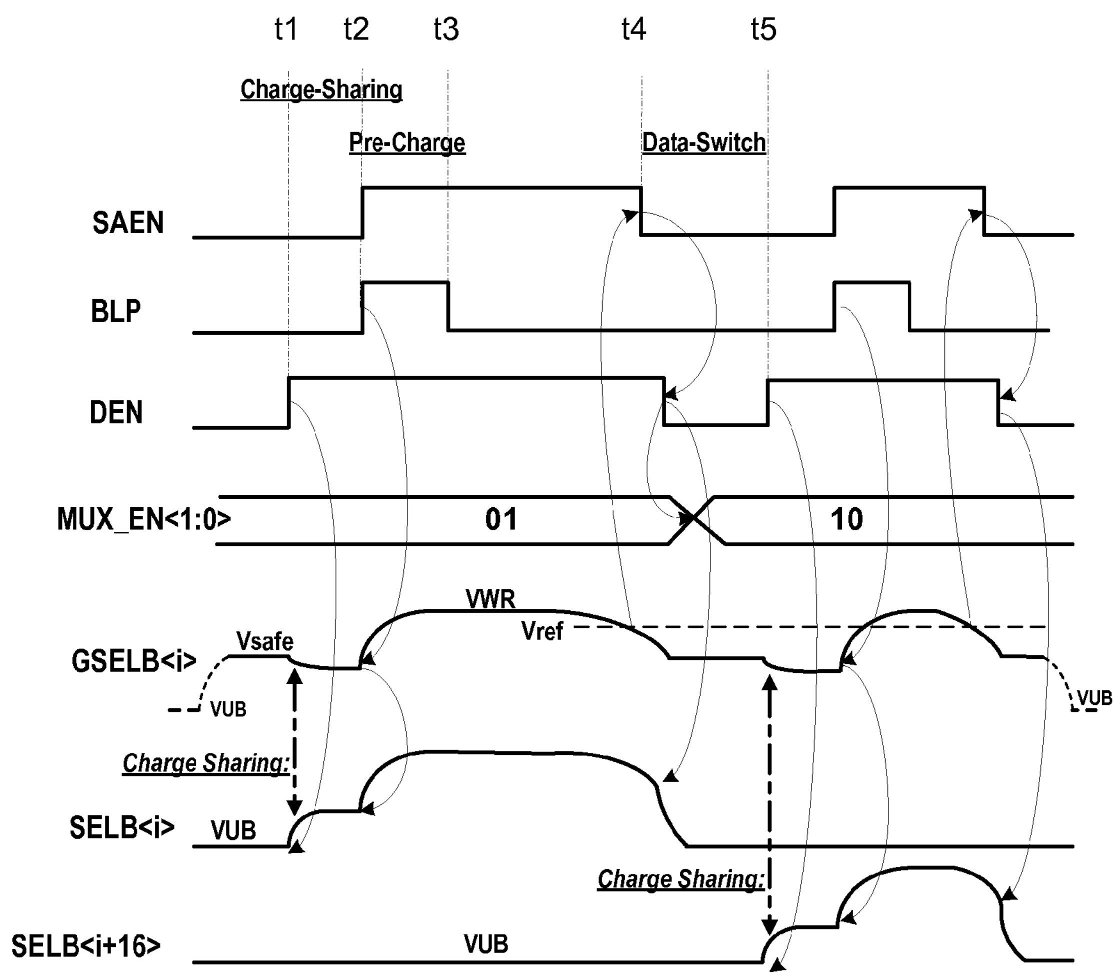
FIG. 12 is a timing diagram associated with the circuits of FIGS. 10 and 11.

FIG. 12 is timing diagram that depicts the behavior of the following signals from FIGS. 10 and 11: SAEN, BLP, DEN, MUX_EN<1:0>, GSELB<i>, SELB<i>, and SELB<i+16>. In the portion of time depicted in FIG. 12, SAEN, BLP, DEN are initially at logic 0, MUX_EN<1:0> is at "01", GSELB<i> is brought up to Vsafe from VUB, SELB<i> is at VUB, and SELB<16> is at VUB. At time t1, DEN goes high to connect SELB<i> to GSELB<i> for the first phase of the memory operation, which allows charge sharing between GSELB<i> and SELB<i>. At time t2, BLP is raised high to pre-charge the appropriate bit line to the write voltage VWR via SELB<i> and GSELB<i>. SAEN also goes high at t2 to enable the sense amplifier to drive VWR. Between t3 and t4, the appropriate memory operation is performed and the sense amplifier detector will sense the completion of the memory operation (the first phase) for the first bit selected. In response to the sensing the completion of the memory operation (e.g., the memory cell successfully SET because GSELB<i> was detected at Vref), the DETECTED signal will go high, causing SAEN to go low and DEN to provide the low pulse. As discussed above, the low pulse in DEN will cause MUX_EN<1:0> to shift from 01 to 10. In response to DEN going low, SELB<i> will be connected to VUB, as discussed above. When DEN goes back high at the end of the negative pulse, SELB<i+16> will be communication with GSELB<i> so there will be charge sharing between the local data line SELB<i+16> and the global data line GSELB<i> after T5. BLP will then be raised high to allow the pre-charging. After the pre-charging, a memory operation will be performed for the second input to the multiplexer. Eventually, GSELB<i> will be detected to reach Vref, which will trigger the lowering of SAEN and the lowering of DEN. At that point, the second phase of the memory operation has completed and the circuit will wait for the next column to be selected when all the remaining sense amplifiers connected to different GSELB's have completed the write operation on the associated 2 SELB's. Note that FIG. 12 shows one global data line (GSELB<i>) and one pair of local data lines SELB<i>/SELB<i+16>; however the programming process described by FIG. 12 will be performed concurrently on multiple non-volatile storage elements using other global data lines and other local data lines.

Figure 13:
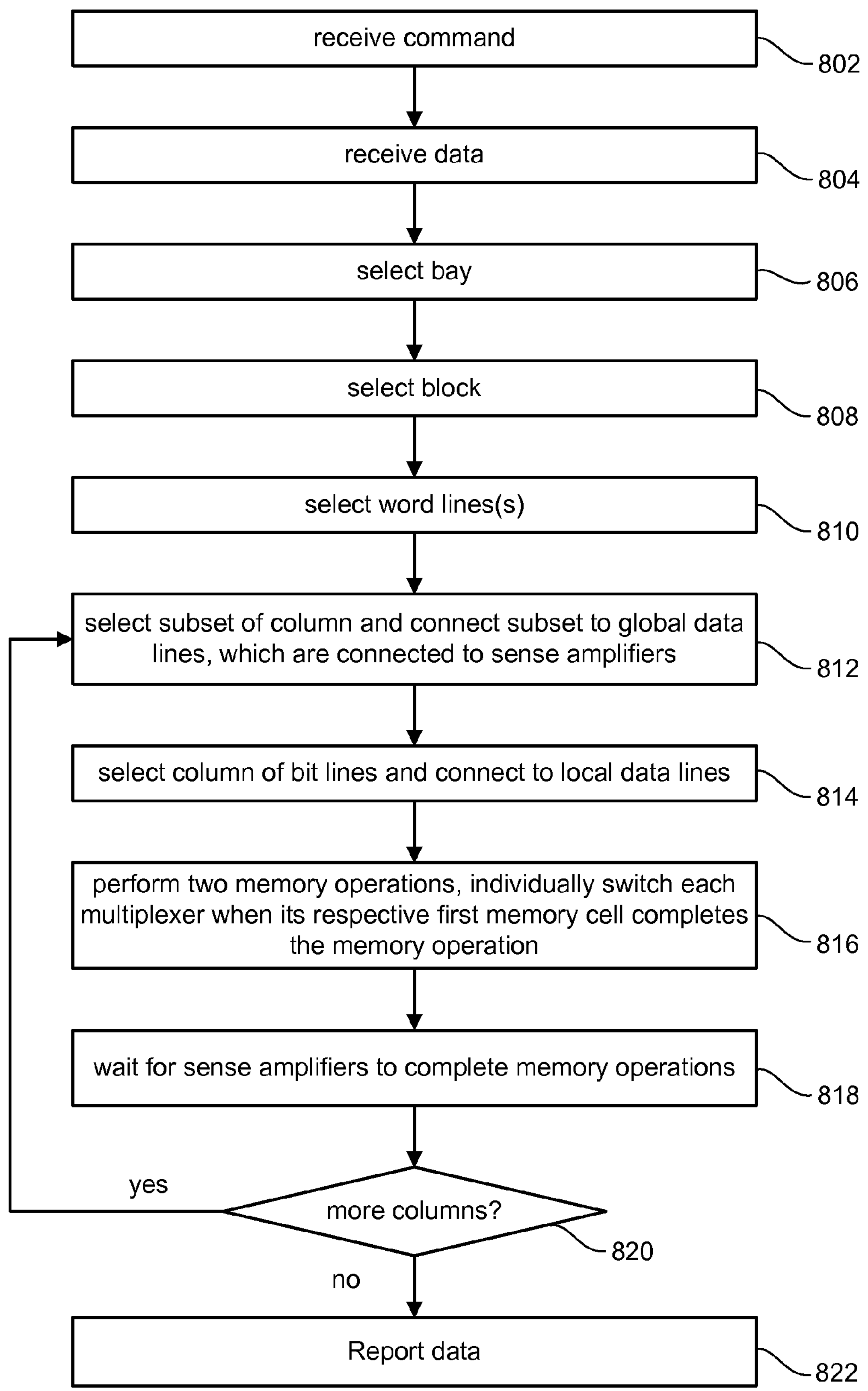
FIG. 13 is a flow chart describing one embodiment of a process for operating the data lines and selection circuits.

FIG. 13 is a flow chart describing the operation of system described above. In step 802, a command to perform a memory operation is received from the host. In step 804, data for the memory operation is received, if any. In step 806, one bay is selected. In some embodiments, it may be possible to select more than one bay for simultaneous operations. In step 808, a block within the selected bay is selected for a memory operation. Alternatively, one block within each selected bay is selected. In step 810, the appropriate word line(s) is/are selected. In step 812, a subset of the local data lines is selected using the multiplexers described above and, thereby, connected to the global data lines for the bay. These global data lines are in communication with the appropriate sense amplifiers or other relevant circuits. In step 814, one of the columns within the selected block is selected and the bit lines for that column are connected to the appropriate set of local data lines, as discussed above. In step 816, the desired memory operation(s) is/are performed. Step 816 includes performing the memory operation twice (two phases), once for each of the two data lines connected to the multiplexers discussed above. The memory operation is performed concurrently on multiple storage elements using multiple sets of global and local data lines. During step 816, the multiplexers can be independently switched, as discussed above, to start the memory operation on the second of the two data lines without having to wait for results from the sense amplifiers associated with other multiplexers. In step 818, the process waits for all sense amplifiers to have completed the memory operations for both of their respective data lines before continuing to the next column. If there are more columns to operate on (step 820), the process continues at step 812. If there are no more columns to operate on (step 820), then the process continues at step 822 at which time the results (data read or success/failure of programming) of the memory operation are reported to the host device that is in communication with the memory system. The process of steps 812-818 can be repeated multiple times, for example, once for each column in the block. The steps of FIG. 13 can be performed in other orders. The exact scheme (e.g. voltage and current levels) for programming or reading depends on the type of memory cell used.

The technology described herein can be used with many different types of memory cells and memory architectures. Some embodiment may implement a different ratio of local data lines to global data lines. For example, 32 local data lines can be used to connect to 8 global data lines. In such a case, a 4:1 multiplexer will need to be used. In another embodiment, 64 local data lines can be used to connect to 8 global data lines, thereby requiring an 8:1 multiplexer. The proposed programming scheme that includes the multiplexers changing the selections independently of each other can be performed with the above-mentioned 4:1 multiplexer, the above-mentioned 8:1 multiplexer, or other selection circuits. In such cases, step 816 of FIG. 13 will include performing four memory operations for the embodiment with the 4:1 multiplexer and eight for the embodiment with the 8:1 multiplexer. Step 816 can include performing other numbers of memory operations depending on the size/architecture of the selection circuit implemented.

One example provided above for performing a SET operation is to discharge a bit line through the memory cell, and into the word line. The bit line stores charge based on its parasitic capacitance. The process can be used with the architecture of FIG. 8. That is, FIG. 8 describes a system that independently changes multiplexer selections without regard to other sense amplifiers so that a second memory cell connected to the multiplexer can be programmed prior to the completion of the first memory cell for other multiplexers. In one embodiment, the memory operation being performed on both memory cells connected to the multiplexer (as well as performed on other memory cells connected to other multiplexers) is the discharge method described above, or a variation thereof. For example, when performing the process of FIG. 13, step 816 can include performing SET operations on the memory cells connected to the multiplexers using the discharge method.

When using the discharge methods described above, the system will first perform the SET operation for the first memory cell connected to a given multiplexer. The first memory cell receives the charge from its bit line, which receives the charge from the global data line. For example, the multiplexers MUX will select the appropriate local data line and the sense amplifier will drive VWR to charge GSELB<i> and SELB<i> using a pulse. Selections circuit 500 will connect SELB<i> to the bit line, at which time GSELB<i> and SELB<i> will share/transfer charge to the selected bit line. Therefore, the bit line will charge up. After the bit line charges up, the sense amplifier stops driving and will start monitoring the Global Data line GSELB<i> voltage. Once the bit SETs (also called POP), it will start conducting current, thus, discharging the bit line, local data line SELB<i> and global data line GSELB<i>. Once the Global Data line GSELB<i> voltage drops below the reference voltage Vref, the signal, DETECTED is asserted (see discussion above) and DEN will be pulsed (negative pulse—see discussion above) to cause the multiplexer to switch selections and cut off the local data line SELB<i> and bit line from GSELB<i>. The multiplexer switches to the second local data line (SELB<i+16>). GSELB<i> is charged again and connected to the second local data line without having to wait for the SET operation to complete for the first memory cell selected by the other multiplexers in that block. After the second bit line is charged so that the SET operation starts for the second memory cell, the multiplexer will wait for the column address to change before switching to the next bit.

Figure 14:
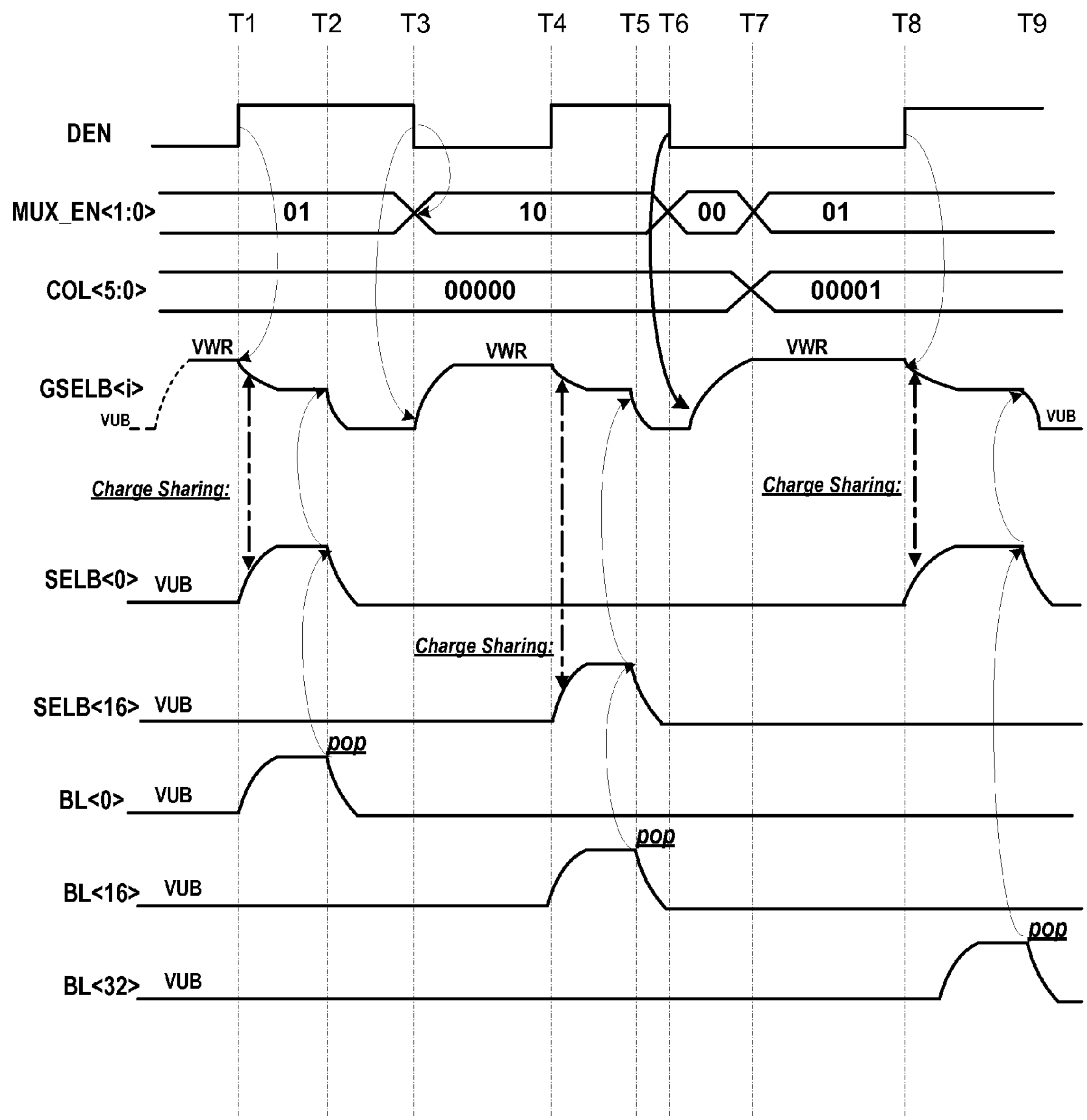
FIG. 14 is a timing diagram associated with the capacitive discharge programming operation.

FIG. 14 is a timing diagram that explains the operation of the discharge method with the architecture of FIG. 8. FIG. 14 shows the signals DEN, MUX_EN<1:0>, COL<5:0>, GSELB<i>, SELB<0>, SELB<16>, BL<0>, BL<16> and BL<32>. The signal COL<5:0> selects which of the 64 columns (see FIG. 8) is selected for connection to the local data lines SELB. The signal BL<0>, BL<16> and BL<32> are three example bit lines. The bit line BL<0> is in column 0 and connectable to SELB<0>, BL<16> is in column 0 and connectable to SELB<1>, and BL<32> in column 1 and connectable to SELB<0>. At the start of the time period depicted in FIG. 14, DEN is low, MUX_EN<1:0>=01, COL<5:0>=00000, and the remaining signals are at VUB. GSELB<i> receives a voltage pulse and is charged up to VWR (Vset or Vreset). GSELB<i> is then floated or otherwise cut off from the voltage source. At time T1, DEN goes high which causes the multiplexer MUX (see FIG. 8) to connect SELB<0> to GSELB<i>. Since column 0 is selected, bit line BL<0> is connected to SELB<0>; therefore, BL<0> will charge up in response to the charge form GSELB<i>.

At time T2, the memory cell connected to BL<0> is SET (pop) to the low resistance state; therefore, the charge on the bit line (and on the local and global data lines) will dissipate through the memory cell. In response to detecting the memory cell being SET (pop) to the low resistance state (e.g., detecting the dissipation of charge), the sense amplifier will assert the DETECTED signal and DEN will exhibit a negative pulse between T3 and T4. The falling edge of the negative pulse on DEN will cut off GSELB<i> from the local data lines and cause the D flips flops 766 and 768 to change the multiplexer enable signal to select the second local data line SELB<16> at or near T3. Since GSELB<i> is cut off from the local data lines at T3, the sense amplifier will apply another pulse to charge up GSELB<i>.

At T4, the rising edge of DEN will allow GSELB<i> to be connected to SELB<16> so that the bit line BL<16> connected to SELB<16> will charge up based on the charge from GSELB<i>. At time T5, the selected memory cell connected to bit line BL<16> is SET to the low resistance state and the charge on the bit line BL<16> (as well as on the local and global data lines) dissipates through the selected memory cell connected to BL<16>.

In response to detecting the memory cell being SET (pop) to the low resistance state (e.g., detecting the dissipation of charge), the sense amplifier will assert the DETECTED signal and DEN will exhibit a negative pulse starting at T6. The falling edge of the negative pulse on DEN will cut off GSELB<i> from the local data lines, as a 0 gets propagated from D flip-flop 766 to D flip-flop 768. At this point, the MUX_EN<1:0> has a value of 00. That is, no global data line is connected to a local data line for this specific sense amplifier. Since GSELB<i> is cut off from the local data lines at T6, the sense amplifier will apply another pulse to charge up GSELB<i>. Other sense amplifiers might still be at different phases of the process described, (e.g., programming the first local line or programming the second local line).

Before proceeding to the next bit line, the process needs to wait for all the remaining sense amplifiers to finish all of the concurrent memory operations. There will be logic in the page register that will combine the data values and the DETECTED signals. Once the page register determines that all sense amplifiers have completed the two memory operations, the column address can be switched. Signal PCHGC (see FIG. 11) will be asserted, setting D flip-flop 766 and resetting D flip-flop 768. At that point the multiplexer enable signal selects the first local data line SELB<0>. In a way, the operations are two memory operations are asynchronous and concurrent but they are synchronized before columns can be switched.

At time T7 the page register determines that all other sense amplifiers have completed the memory operation on both associated local data lines (that is, all DETECTED signals for the second memory operations have been asserted). The column address will be incremented from COL<5:0>=00000 to COL<5:0>=00001. Signal PCHGC of FIG. 11 will be asserted, setting D flip-flop 766 and resetting D flip=flop 788 (as evidence by MUX_EN changing from 00 to 01 at T7).

At T8, the rising edge of DEN (caused by DATA signal switching) will allow GSELB<i> to be connected to SELB<0> so that the bit line BL<32> (of column 1) connected to SELB<0> will charge up based on the charge from GSELB<i>. At time T9, the selected memory cell connected bit line BL<32> is SET to the low resistance state and the charge on the bit line BL<32> (as well as on the local and global data lines) dissipates through the selected memory cell connected to BL<32>. This process will continue in the same manner. Additionally, this process is performed concurrently on each memory cell connected to each of the sixteen multiplexers in a block. Multiple blocks can also be operated on at the same time.

Figure 15:
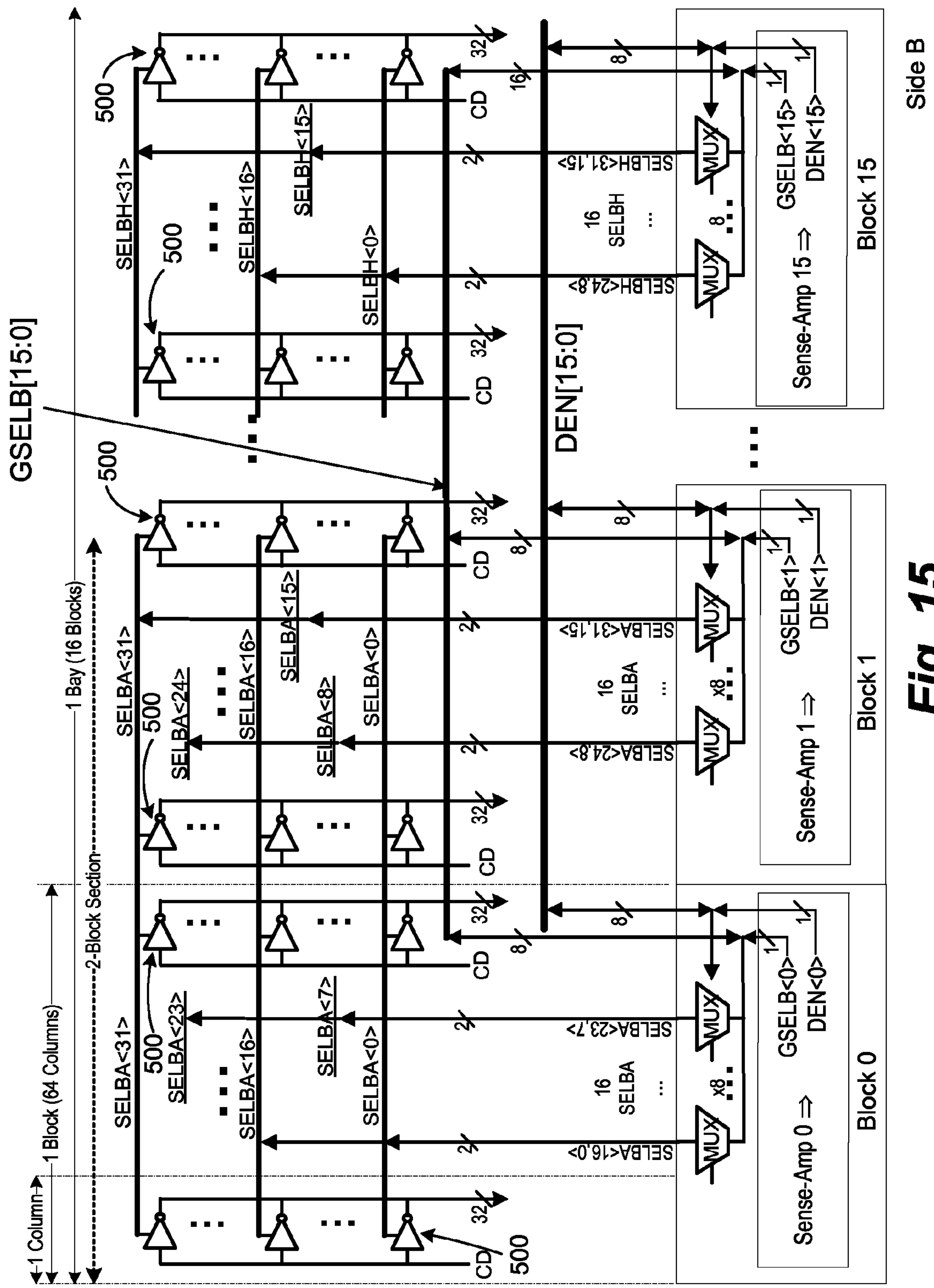
FIG. 15 is a schematic diagram of one embodiment of the data lines and selection circuits for connecting bit lines to the column control circuitry via the data lines.
Figure 16:
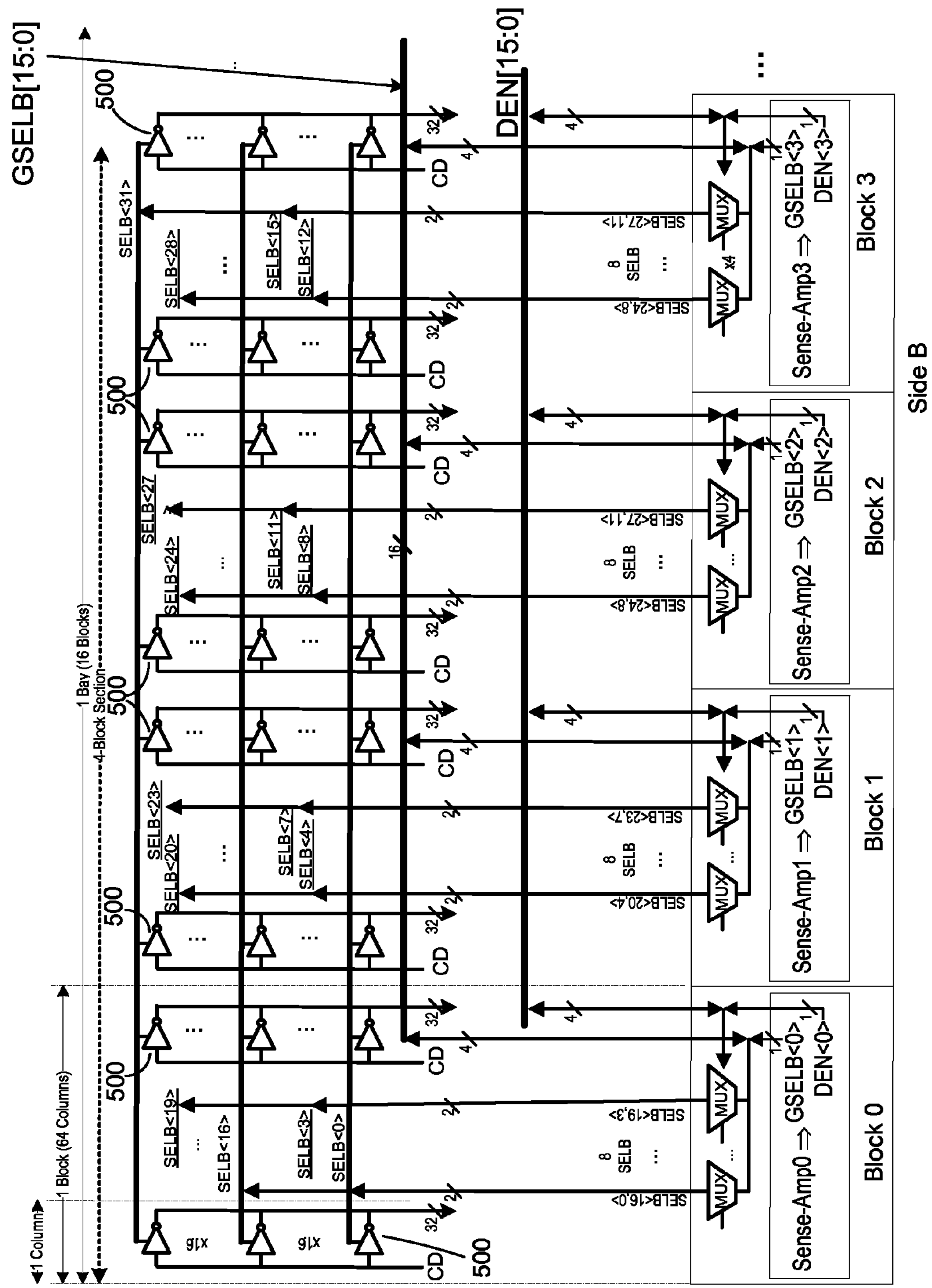
FIG. 16 is a schematic diagram of one embodiment of the data lines and selection circuits for connecting bit lines to the column control circuitry via the data lines.

In FIG. 8, each block of memory cells includes its own set of local data lines SELB<31:0>. FIG. 15 provides an example of an embodiment where sets of local data lines are each shared by two blocks. FIG. 16 provides an example of another embodiment where sets of local data lines are each shared by four blocks. In other embodiments, other numbers of blocks can share a set of local data lines.

FIG. 15 shows sixteen blocks comprising a bay. Like FIG. 8, FIG. 15 only shows the routing signals and selection circuits for connection to one side (e.g. side B). In the embodiment of FIG. 15, a set of data lines are shared by two blocks. For example, SELBA<31:0> are shared by block 0 and block 1, SELBB<31:0> (not depicted) are shared by block 2 and block 3, . . . and SELBH<31:0> are shared by block 14 and block 15. Each set of local data lines are implemented in metal layer R1 and/or metal layer R2 in the space below the associated blocks. For example, SELBA<31:0> are implemented below block 0 and block 1. FIG. 15 depicts 64 columns for each block, with each column including 32 selection circuits 500 for selecting 32 bit lines to be connected to the local data lines.

The local data lines are connected to sixteen multiplexers (MUX). Eight of the sixteen multiplexers are associated with and located below a first of the two blocks and the other eight multiplexers are associated with and located below the second of the two blocks. For example, sixteen of the SELBA lines are connected to multiplexers (MUX) bellow block 0 and sixteen of the SELBA lines are connected to multiplexers (MUX) bellow block 1. In response to a selection signal from column decoders 112, sixteen of the thirty two local data lines are connected to the global data lines GSELB<15:0>.

Each of the global data lines GSELB<15:0> are connected to one of the sense amplifiers. For example, the output Sense-Amp0 of the sense amplifier located underneath block 0 is connected to GSELB<0>, the output Sense-Amp1 of the sense amplifier located underneath block 1 is connected to GSELB<1>, . . . and the output Sense-Amp15 of the sense amplifier located underneath block 15 is connected to GSELB<15>. Thus, the output of a particular sense amplifier is connected to a global data line, then to a local data line by way of a multiplexer, and then to a bit line by way of a selection circuit.

As mentioned above, FIG. 15 only shows the connection paths to sense amplifiers on one side (e.g., side B) of the blocks. Thus, there is another set of local data lines for each pair of blocks, another set of global data lines for each bay and another set of sense amplifiers for each bay in addition to that which is depicted for FIG. 15.

Like FIG. 8, the circuit of FIG. 15 also shows each of the sense amplifier generating a respective DEN signal for transmission to the appropriate multiplexers to perform the processes described above.

By having two blocks share a set of local data lines, the number of multiplexers and the number of signal lines to and from the multiplexers is reduced.

FIG. 16 depicts an embodiment where four blocks share a set of local data lines. Therefore, each bay (which includes sixteen blocks) would have four sets of local data lines that can be selectively connected to one set of global data lines for that bay. For ease of viewing, FIG. 16 only depicts four blocks: block 0, block 1, block 2 and block 3, all of which share local data lines SELB<0:32>. The local data lines SELB<0:32> are implemented in metal layer R1 or metal layer R2 underneath blocks 0-3.

Like FIG. 8, FIG. 16 only shows the routing signals and selection circuits for connection to one side (e.g. side B). FIG. 16 depicts 64 columns for each block, with each column including 32 selection circuits 500 for selecting 32 bit lines to be connected to the local data lines SELB.

The local data lines are connected to sixteen multiplexers (MUX). Four of the sixteen multiplexers are associated with and located below each of the four blocks. For example, eight of the SELB lines are connected to multiplexers (MUX) below block 0, eight of the SELB lines are connected to multiplexers (MUX) bellow block 1, eight of the SELB lines are connected to multiplexers (MUX) bellow block 2 and eight of the SELB lines are connected to multiplexers (MUX) bellow block 3. In response to a selection signal from column decoders 112, sixteen of the thirty two local data lines SELB<31:0> are connected to the global data lines GSELB<15:0>.

Each of the global data lines GSELB<15:0> are connected to one of the sense amplifiers. For example, the output Sense-Amp0 of the sense amplifier located underneath block 0 is connected to GSELB<0>, the output Sense-Amp1 of the sense amplifier located underneath block 1 is connected to GSELB<1>, . . . and the output Sense-Amp15 of the sense amplifier located underneath block 15 is connected to GSELB<15>. Thus, the output of a particular sense amplifier is connected to a global data line, then to a local data line by way of a multiplexer, and then to a bit line by way of a selection circuit.

As mentioned above, FIG. 16 only shows the connection paths to sense amplifiers on one side (e.g., side B) of the blocks. Thus, there is another set of local data lines for each group of blocks, another set of global data lines for each bay, and another set of sense amplifiers for each bay in addition to that which is depicted for FIG. 16. By having four blocks share a set of local data lines, the number of multiplexers and the number of signal lines to and from the multiplexers is reduced. In other embodiments, eight, sixteen or other numbers of blocks can share a set of local data lines.

Like FIG. 8, the circuit of FIG. 16 also shows each of the sense amplifiers generating a respective DEN signal for transmission to the appropriate multiplexers to perform the processes described above.

The technology described above can (but does not need to) be used with the driver/selection circuit of FIG. 10 of U.S. patent application Ser. No. 12/410,648, "Memory System With Sectional Data Lines," filed on Mar. 25, 2009, incorporated herein by reference in its entirety, in the manner depicted in FIG. 11 and FIG. 12A of that same application.

One embodiment includes a plurality of non-volatile storage elements, one or more control circuits that perform memory operations and a first set of selection circuits. Each selection circuit of the first set of selection circuits is in communication with the one or more control circuits and a different group of two or more of the non-volatile storage elements so that during memory operations each selection circuit of the first set of selection circuits selectively connects a respective first non-volatile storage element of the group to the one or more control circuits until a memory operation completes for the first non-volatile storage element of the group and then selectively connects a second non-volatile storage element of the group to the one or more control circuits independent of other selection circuits of the first set of selection circuits.

One embodiment includes concurrently performing a memory operation on a first non-volatile storage element of each group of a plurality of groups of non-volatile storage elements, independently detecting completion of the memory operation for the first non-volatile storage element of each group, and independently commencing a memory operation on a second non-volatile storage element of each group upon independently detecting completion of the memory operation for the first non-volatile storage element of each group.

One embodiment of a data storage system includes a plurality of non-volatile storage elements. The plurality of non-volatile storage elements includes multiple subsets of non-volatile storage elements. The multiple subsets of non-volatile storage elements include a first subset of non-volatile storage elements. The data storage system further includes control lines in communication with the non-volatile storage elements, local data lines (each subset of non-volatile storage elements includes its own set of local data lines), a set of global data lines for the multiple subsets of non-volatile storage elements, first selection circuits (the first selection circuits selectively connect a subset of the local data lines to the global data lines, second selection circuits that selectively connects a subset of the control lines to the first local data lines, and control circuits in communication with the global data lines. Each selection circuit of the first set of selection circuits is in communication with a different group of two or more of the local data lines and one global data line so that during memory operations each selection circuit of the first set of selection circuits selectively connects a respective first non-volatile storage element to the control circuits until a memory operation completes for the respective first non-volatile storage element and then selectively connects a respective second non-volatile storage element to the control circuits independent of other selection circuits of the first set of selection circuits in order to perform a memory operation for the second non-volatile storage element.

One embodiment of a method of operating a data storage system includes selectively connecting a set of control lines to a set of local data lines so that each local data line of the set of local data lines is connected to one control line of the set of control lines. Each control line is in communication with a different non-volatile data storage element so that each data line of the set of local data lines is in communication with a respective non-volatile storage element. The set of local data lines includes a first subset of the local data lines and a second subset of the local data lines. The method further includes selectively connecting the first subset of the local data lines to a set of global data line (the global data lines are connected to control circuitry), performing a first memory operation on non-volatile storage elements in communication with the first subset of local data lines (the memory operation is performed using the control circuitry), separately detecting when each non-volatile storage elements in communication with the first subset of local data lines has completed the memory operation, for each global data line of the set of global data lines independently disconnecting a respective local data line of the first subset of local data lines and independently connecting a local data line from the second subset of local data lines in response to detecting completion of the memory operation for the respective non-volatile storage element in communication with the respective local data line of the first subset of local data lines, and performing a second memory operation on non-volatile storage elements in communication with the second subset of local data lines. The second memory operation is started independently for non-volatile storage elements in communication with the second subset of local data lines in response to selectively connecting respective local data lines from the second subset of local data lines to the global data lines.

One embodiment includes a plurality of groups of non-volatile storage elements, means for concurrently performing a memory operation on a first non-volatile storage element of each group of the plurality of groups of non-volatile storage elements, means for independently detecting completion of the memory operation for the first non-volatile storage element of each group, and means for independently commencing a memory operation on a second non-volatile storage element of each group upon independently detecting completion of the memory operation for the first non-volatile storage element of each group.

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for operating a data storage system of groups of non-volatile storage elements in which each group has its own set of first local data lines and its own set of second local data lines, comprising:

selectively connecting by first selection circuits the set of first local data lines for each group of the non-volatile storage elements to global data lines;

selectively connecting by second selection circuits each set of first local data lines to control lines in communication with a first subset of the non-volatile storage elements of the respective group;

concurrently beginning a memory operation on the first subsets of non-volatile storage elements in the groups;

independently detecting completion of the memory operation for each non-volatile storage element of the respective first subset; and responsive to independently detecting completion of the memory operation on a respective non-volatile storage element of the respective first subset, independently selectively connecting a respective second local data line by a respective first selection circuit to a respective global data line and selectively connecting the respective second local data line by a respective second selection circuit to a control line of a second non-volatile storage element in a second subset of non-volatile storage elements of the respective group and commencing a memory operation on the second non-volatile storage element independently of any other memory operations being performed in respective group.

2. The method of claim 1, further comprising:

responsive to detecting completion of the memory operation on an individual basis for each non-volatile storage element of the respective first subset, disconnecting a respective first local data line by respective first selection circuit from the respective global data line.

3. The method of claim 1, wherein:

the groups of non-volatile storage elements includes sixteen groups of non-volatile storage elements;

each of the groups of non-volatile storage elements includes two reversible resistance-switching non-volatile storage elements;

the concurrently beginning a memory operation on the first subsets of non-volatile storage elements in the groups comprises changing a resistance of up to sixteen reversible resistance-switching non-volatile storage elements; and the independently detecting completion of the memory operation for each non-volatile storage element of the respective first subset includes detecting change in resistance of the up to sixteen reversible resistance-switching non-volatile storage elements at different times.

4. The method of claim 1, wherein the non-volatile storage elements are reversible resistance-switching non-volatile storage elements and the concurrently beginning a memory operation on the first subsets of non-volatile storage elements in the groups comprises:

applying a charge to a control line connected to a reversible resistance-switching non-volatile storage element for a first period of time that is insufficient to change the reversible resistance-switching non-volatile storage element from a first predetermined resistance state to a second predetermined resistance state; and after the first period of time, allowing the control line to discharge the applied charge through the reversible resistance-switching non-volatile storage element in order to change the reversible resistance-switching non-volatile storage element from the first predetermined resistance state to the second predetermined resistance state, the detecting completion of the memory operation includes detecting the change from the first predetermined resistance state to the second predetermined resistance state.

5. The method of claim 1, wherein:

the concurrently beginning a memory operation on the first subsets of non-volatile storage elements in the groups includes concurrently changing resistance of multiple reversible resistance-switching non-volatile storage elements in a monolithic three-dimensional memory array.

6. The method of claim 1, wherein:

the first non-volatile storage element of each of the groups are all in a common block of non-volatile storage elements.

7. The method of claim 1, wherein commencing a memory operation on the second non-volatile storage element independently of any other memory operations being performed in respective group further comprises:

commencing, for each group, the memory operation on the second non-volatile storage element of the group independently of the detection of completion of the memory operation for at least one first non-volatile storage element of at least one other group and in response to the independent detection of completion of the memory operation for the first non-volatile storage element of the group.

8. The method of claim 1, wherein commencing a memory operation on the second non-volatile storage element independently of any other memory operations being performed in respective group further comprises:

commencing, for each group, the memory operation on the second non-volatile storage element of the group independently of the detection of completion of the memory operation for first non-volatile storage elements of the other groups and in response to the independent detection of completion of the memory operation for the first non-volatile storage element of the group.

* * * * *